(12) United States Patent
Park et al.

(10) Patent No.: US 10,062,425 B2
(45) Date of Patent: Aug. 28, 2018

(54) SELECTIVELY ACTIVATED SYNAPTIC DEVICE WITH ULTRASMALL DIMENSION AND LOW POWER CONSUMPTION

(71) Applicant: KONKUK UNIVERSITY INDUSTRIAL COOPERATION CORP, Gwangjin-gu, Seoul (KR)

(72) Inventors: Bae Ho Park, Seoul (KR); Chansoo Yoon, Busan (KR)

(73) Assignee: KONKUK UNIVERSITY INDUSTRIAL COOPERATION CORP, Seoul (KR)

(*) Notice: Subject to any disclaimer, the term of this patent is extended or adjusted under 35 U.S.C. 154(b) by 0 days.

(21) Appl. No.: 15/638,758

(22) Filed: Jun. 30, 2017

(65) Prior Publication Data

US 2018/0019011 A1  Jan. 18, 2018

(30) Foreign Application Priority Data

Jul. 1, 2016 (KR) .................. 10-2016-0083260

(51) Int. Cl.
| | |
|---|---|
| *G11C 11/22* | (2006.01) |
| *H01L 27/115* | (2017.01) |
| *H01L 45/00* | (2006.01) |
| *H01L 49/02* | (2006.01) |
| *H01L 27/11502* | (2017.01) |
| *H01L 27/11507* | (2017.01) |

(52) U.S. Cl.
CPC ...... *G11C 11/221* (2013.01); *H01L 27/11502* (2013.01); *H01L 28/55* (2013.01); *H01L 28/60* (2013.01); *H01L 27/11507* (2013.01)

(58) Field of Classification Search
CPC ..... G11C 11/221; H01L 28/55; H01L 45/085; H01L 45/147; H01L 27/11502
See application file for complete search history.

(56) References Cited

PUBLICATIONS

Mao et al. "Unconventional resistive switching behavior in ferroelectric tunnel junctions." Phys. Chem. Chem. Phys., 2015, 17, 10146.*
Office Action dated Aug. 1, 2017 in KR Application No. 10-2016-0083260.
Soni et al, "Giant Electrode Effect on Tunnelling Electroresistance in Ferroelectric Tunnel Junctions," Nature communications, vol. 5, No. 5414, pp. 1-10 (2014).

* cited by examiner

*Primary Examiner* — Allison P Bernstein
(74) *Attorney, Agent, or Firm* — Panitch Schwarze Belisario & Nadel LLP

(57) ABSTRACT

Provided herein are a capacitor, a memory device including the capacitor, and a method of manufacturing the capacitor. The capacitor is manufactured by directly depositing a metal electrode having high ion mobility on an ultrathin ferroelectric layer having a certain thickness, and thus may simultaneously use metal cation migration and ferroelectric polarization inversion, and a low-power and high-performance capacitor capable of being selectively activated may be provided by simultaneously controlling an external electric field and an internal electric field caused by polarization of the inside of a ferroelectric thin film.

12 Claims, 23 Drawing Sheets

On-state  Off-state (°)

(mV)

(pm)

FIG. 3F
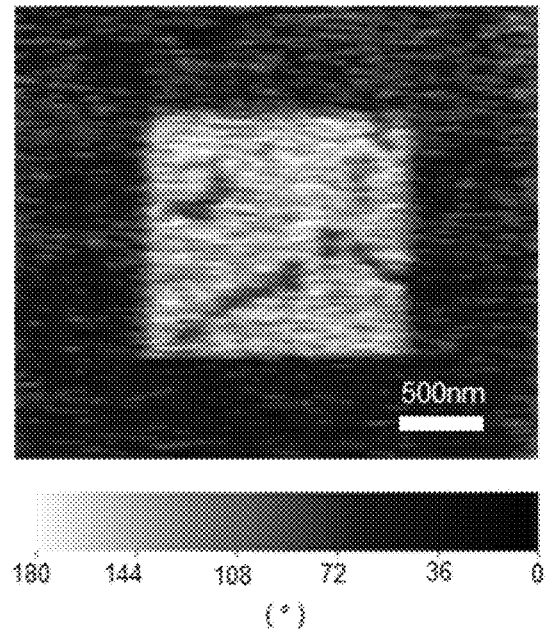
FIG. 4A
FIG. 4B
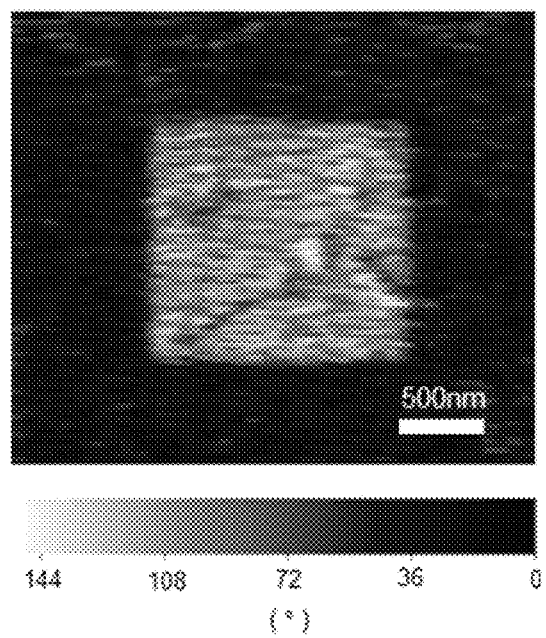

On-state

Off-state

FIG. 13C
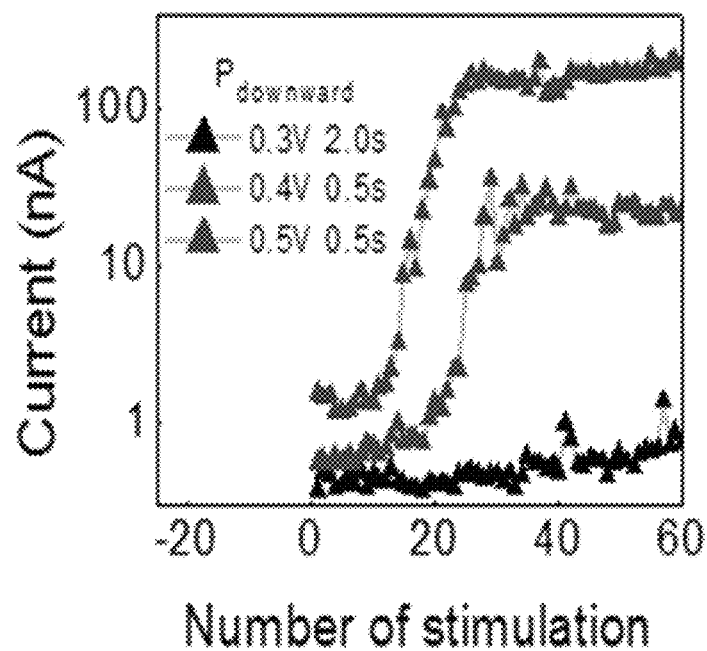
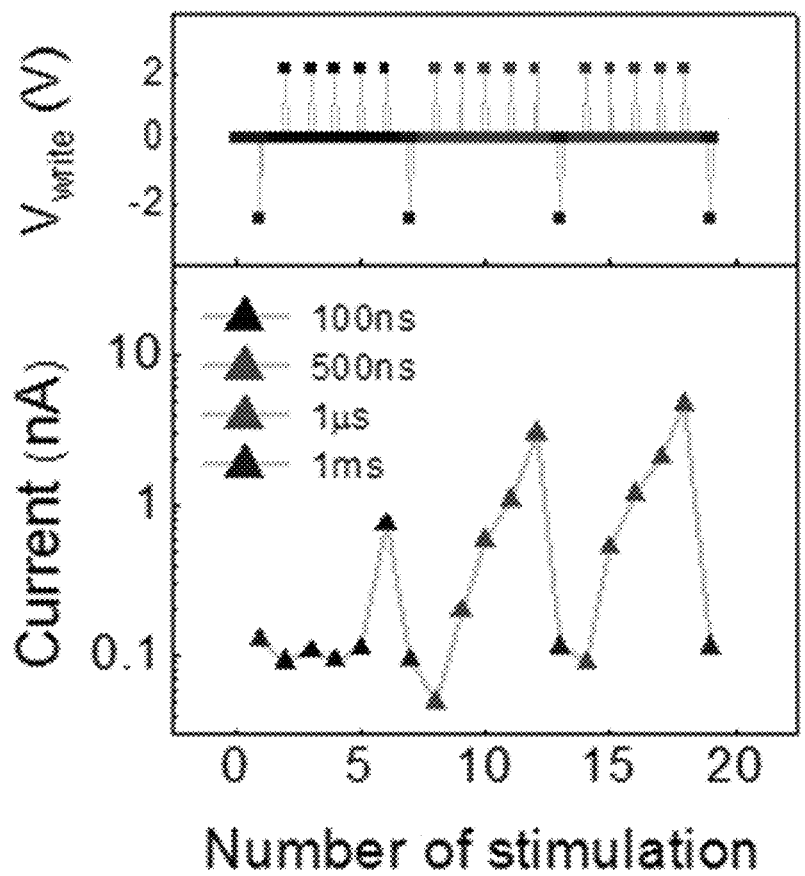
FIG. 14A

FIG. 14B
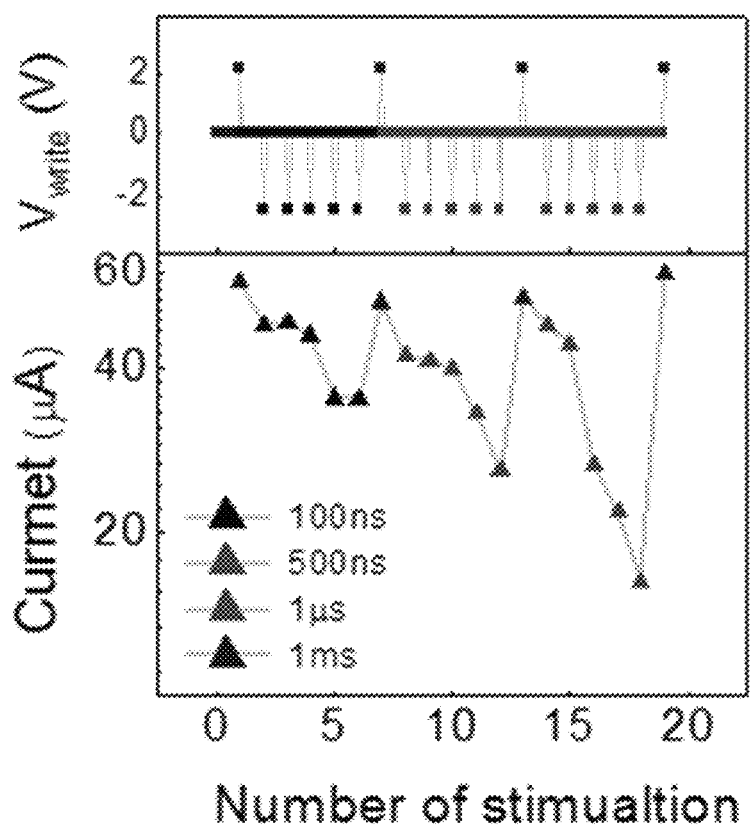
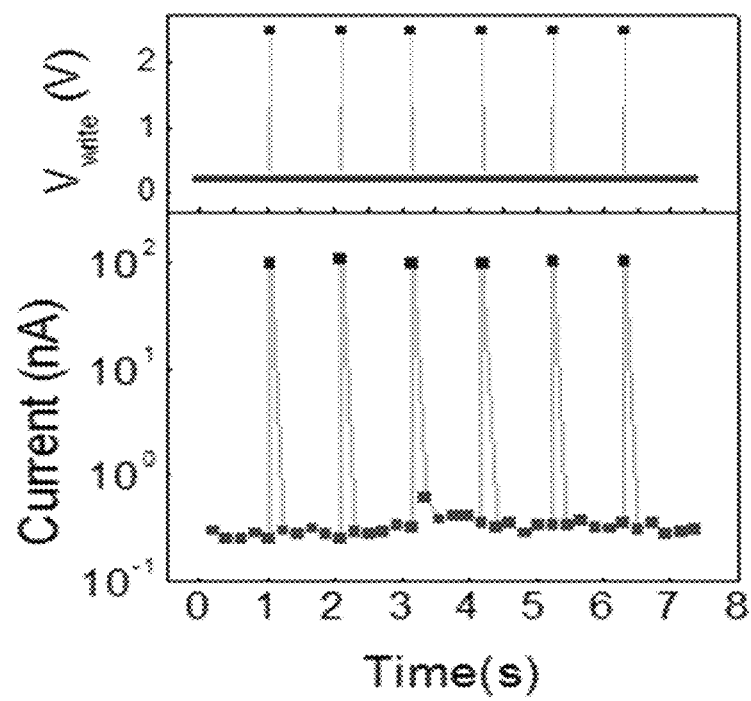
FIG. 15A

FIG. 15B
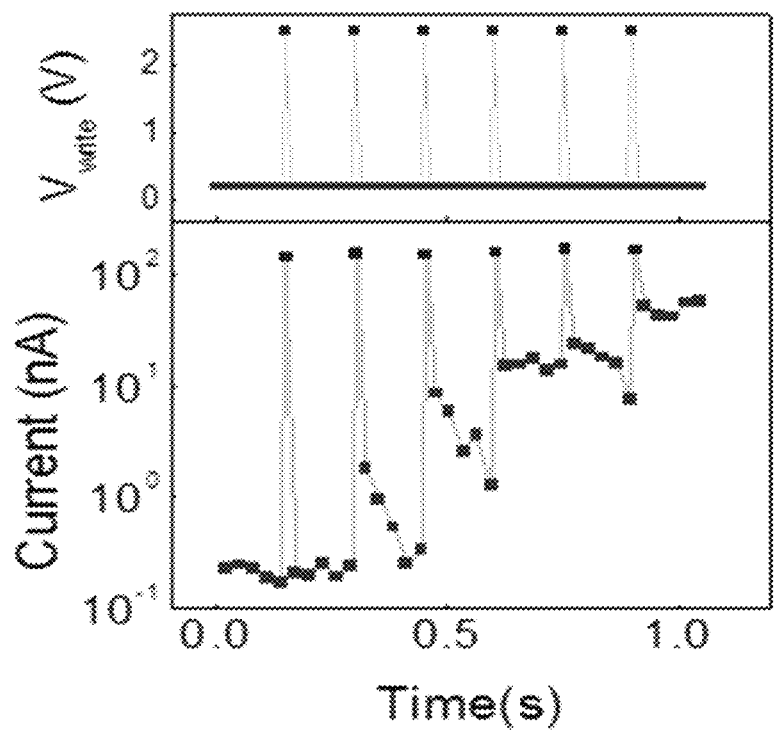
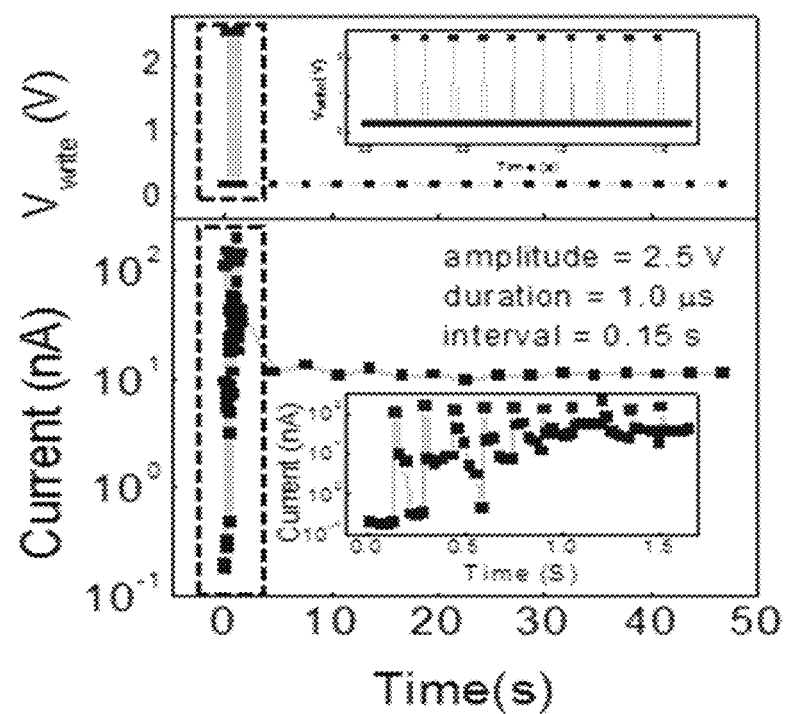
FIG. 15C

FIG. 15D
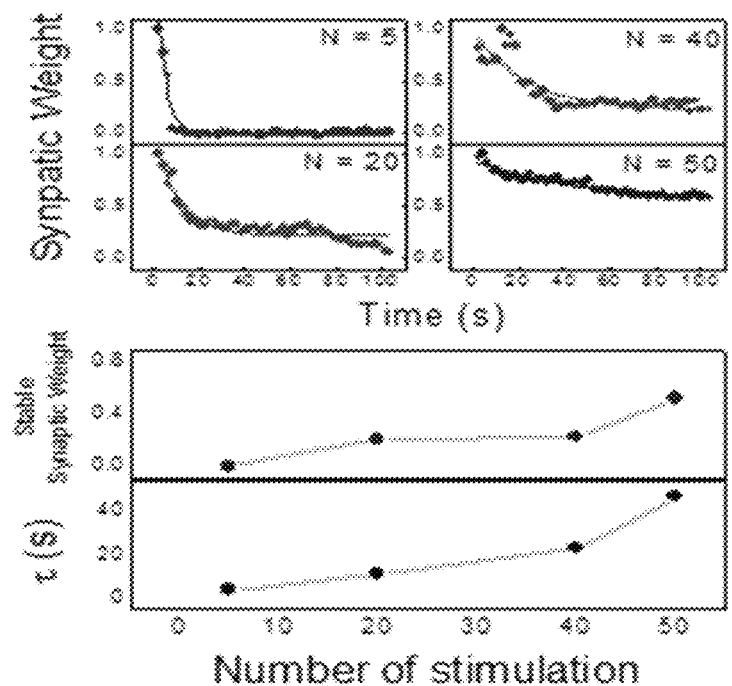
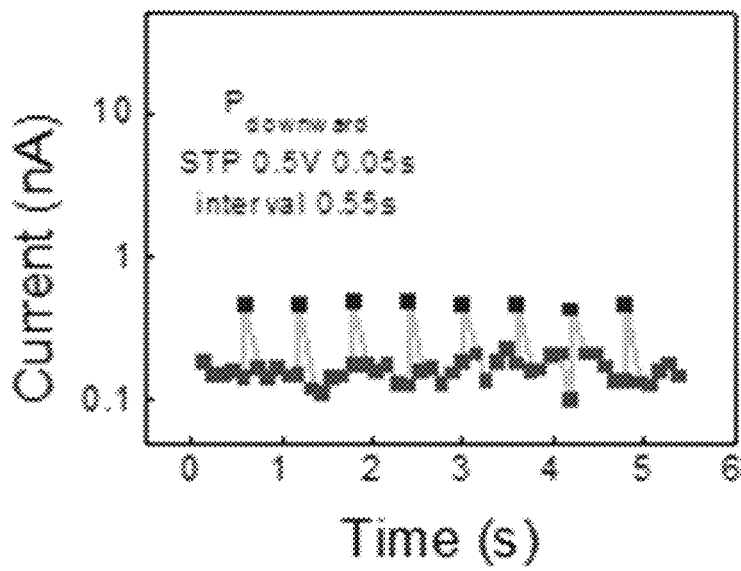
FIG. 16A

SELECTIVELY ACTIVATED SYNAPTIC DEVICE WITH ULTRASMALL DIMENSION AND LOW POWER CONSUMPTION

CROSS-REFERENCE TO RELATED APPLICATIONS

This application claims priority under 35 USC § 119(a) of Korean Patent Application No. 10-2016-0083260 filed on Jul. 1, 2016, the subject matter of which is hereby incorporated by reference.

BACKGROUND OF THE INVENTION

1. Field of the Invention

The present disclosure relates to a capacitor, a memory device including the same, and a method of manufacturing the capacitor.

2. Discussion of Related Art

In neuromorphic computing, synapses play a key role by changing their connection strength between two neurons, as is known as synaptic plasticity. The synaptic plasticity on which the brain's memorizing ability is based may be classified as short-term plasticity (STP) and long-term potentiation (LTP) that are respectively achieved through temporal reinforcement and permanent reinforcement of synaptic connections. Memristors with gradually changing conductivity are also applicable to mimic neuromorphic computing performed by biological synapses. Since $10^{15}$ synapses present in the human brain consume about 10 W per synapse event for a period of about 100 ms despite its enormous number, a synapse must have low energy consumption and ultra-small size. In addition, in neurons, synaptic plasticity may be dynamically regulated by astrocytes, which can alter circuitry between neurons.

A two-terminal ferroelectric tunnel junction (FTJ), where gradual conductance modulation is accompanied by a change in the ferroelectric domain configuration, is considered as a synaptic device with low energy consumption. However, the transition between STP and LTP by stimulation has not been reported in FTJ-based synaptic devices. In addition, an on/off ratio of the FTJ is much smaller than an on/off ratio of an existing resistance switching device such as a conductive bridge memory device.

Conductive bridge memory devices, in which conductive bridges can be repeatedly formed and destroyed by rapid diffusion of cations, have mimicked biological ups and downs of synapses. However, a total thickness of conductive bridge memory-based synaptic devices is greater than that of a single FTJ-based synaptic device, and shortening of its programming time is limited by the migration of cations through nanogaps. In addition, in FTJ-based or conductive bridge memory-based synaptic devices, selective synaptic plasticity without the aid of external selection devices has not been reported.

Existing neuromorphic devices have individually utilized cation migration or ferroelectric polarization inversion. However, a neuromorphic device using cation migration has a limitation in implementation of low power and high integration, and a neuromorphic device using ferroelectric polarization inversion has a low on/off ratio problem and a difficulty in simultaneously realizing volatility and non-volatility. In addition, neuromorphic devices themselves do not have selectivity functions and thus additional selection devices are needed.

BRIEF SUMMARY OF THE INVENTION

The present disclosure provides a high-performance capacitor capable of selectively regulating synaptic plasticity by controlling the migration of active electrode ions through simultaneous use of an external electric field and an internal electric field due to polarization of the inside of a ferroelectric thin film, a memory device including the same, and a method of manufacturing the capacitor.

According to an aspect of the present disclosure, there is provided a capacitor including: a first layer including a conductive oxide; a second layer disposed on the first layer, having a thickness of about 2 nm to about 10 nm, and including a ferroelectric substance; and a third layer directly disposed on the second layer, having a thickness of about 20 nm to about 200 nm, and including an active metal.

According to another aspect of the present disclosure, there is provided a memory device including the capacitor described above.

According to still another aspect of the present disclosure, there is provided a method of manufacturing a capacitor, including: forming a first layer including a conductive oxide on a substrate; forming, on the first layer, a second layer including a ferroelectric substance and having a thickness of about 2 nm to about 10 nm; and forming, on the second layer, a third layer including an active metal and having a thickness of about 20 nm to about 200 nm.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

The above and other objects, features and advantages of the present disclosure will become more apparent to those of ordinary skill in the art by describing in detail exemplary embodiments thereof with reference to the accompanying drawings, in which:

FIGS. 3A to 3F illustrate measurement results of ferroelectricity and a cross-section of a $Pb(Zr_{1-y1}Ti_{y1})O_3$ (PZT) thin film;

FIGS. 4A and 4B are piezoresponse force microscopy (PFM) images of a $PZT/La_{1-x3}Sr_{x3}MnO_3$ (LSMO) heterostructure after 30 minutes and 2 hours at room temperature, respectively;

FIGS. 13A to 13C illustrate measurement results of resistance state changes according to the transfer of ions using DC voltage and polarization direction-dependent ion movement, through pulse stimulation;

FIGS. 14A and 14B illustrate resistance state changes dependent on the program time of pulse stimulation;

FIGS. 15A to 15D illustrate characteristics of short-term memory and long-term memory controlled by repetition periods of pulse stimulation; and FIGS. 16A to 16E respectively illustrate short-term plasticity (STP) and long-term potentiation (LTP) of downward polarization inside the device of Example 1 that mimics biological synapses.

DETAILED DESCRIPTION OF THE INVENTION

Figure 1:
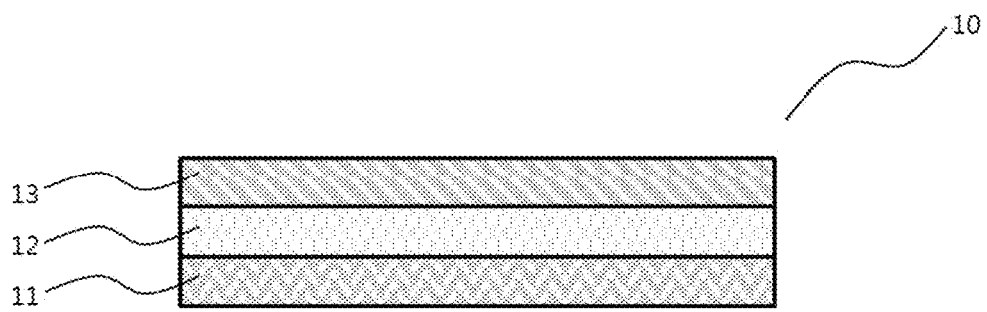
FIG. 1 is a view of an exemplary capacitor of the present disclosure.

Exemplary embodiments of the present disclosure will be described in detail below with reference to the accompanying drawings. While the present disclosure is shown and described in connection with exemplary embodiments thereof, it will be apparent to those skilled in the art that various modifications can be made without departing from the spirit and scope of the invention.

The present disclosure relates to a capacitor. An exemplary capacitor of the present disclosure is manufactured by depositing an active metal electrode on an ultrathin ferroelectric layer having a certain thickness, and thus may simultaneously use metal cation migration and ferroelectric polarization inversion. In addition, a low-power and high-performance capacitor capable of selectively regulating synaptic plasticity may be provided by simultaneously controlling an external electric field and an internal electric field caused by polarization of the inside of a ferroelectric thin film.

The term "active metal" as used herein refers to a metal capable of losing electrons and releasing a cation by application of an external bias or an external electric field, or a metal that can lose electrons and release a cation by the interaction with a solid or liquid electrolyte in an electrochemical cell and directly participates in an electrolytic reaction. The active metal is distinguished from an inert metal, and, for example, the inert metal refers to a metal that does not directly participate in the electrolytic reaction. For example, the inert metal may be iron, graphite, platinum, or the like.

Hereinafter, the capacitor of the present disclosure will be described with reference to the accompanying drawings. These embodiments are provided only for illustrative purposes, and the present disclosure may be embodied in many different forms and should not be construed as being limited to embodiments set forth herein. In addition, in the drawings, a detailed description of elements irrelevant to the description will not be provided herein so as to clearly explain the present disclosure.

FIG. 1 is a view of an exemplary capacitor 10 of the present disclosure.

The capacitor 10 has a multi-layered structure including at least three layers. In one embodiment, as illustrated in FIG. 1, the capacitor 10 includes a first layer 11, a second layer 12, and a third layer 13. Although not shown in the drawings, the capacitor of the present disclosure may further include a substrate and may include, for example, a substrate, and the first layer 11, the second layer 12, and the third layer 13 that are sequentially disposed on the substrate.

The substrate may include a monocrystalline material or a combination of monocrystalline materials, but the present disclosure is not limited thereto.

For example, the monocrystalline material may be $SrTiO_3$, $LaAl_2O_3$, YSZ, MgO, or the like, but the present disclosure is not limited thereto.

In one embodiment, the first layer 11 includes a conductive oxide. For example, the conductive oxide may be a perovskite oxide.

The perovskite oxide refers to a compound having a crystal structure, such as $CaTiO_3$, which is a natural mineral, and may be, for example, a compound represented by Formula 1 below:

$$AMX_3 \qquad \text{<Formula 1>}$$

wherein, in Formula 1, A and M are metal cations, and X is an oxygen anion. In one embodiment, A is a monovalent organic cation, for example, a monovalent organic ammonium ion or $Cs^+$, M is a divalent metal cation, for example, a cation of at least one metal selected from tin (Sn), germanium (Ge), lead (Pb), copper (Cu), zinc (Zn), manganese (Mn), chromium (Cr), titanium (Ti), and Group V elements, and X is an oxygen anion.

Compounds that satisfy Formula 1 above have a perovskite structure, and, in Formula 1, M is positioned at the center of a unit cell in the perovskite structure, and X is positioned at the center of each plane of the unit cell, thereby forming an octahedral structure about M, and A may be positioned at each corner of the unit cell. That is, the compounds may have a structure in which A-site cation is positioned in the middle of a three-dimensional network consisting of corner-shared $MX_6$ octahedra. In other words, the perovskite structure may refer to a structure in which X as an oxygen anion forms an $MX_6$-type octahedron about M as a metal cation in a unit cell, and A as a cation is positioned at each corner of an outer side surface of the octahedron. As is well known, the perovskite structure may include $K_2NiF_4$ types or layered perovskite structures of the same type and $SrTiO_3$ types or complete three-dimensional cubic perovskite structures of the same type.

In one embodiment, a conductive oxide having the perovskite crystal structure may be one or more selected from the group consisting of $Pr_{1-x1}Ca_{x1}MnO_3$(PCMO), $La_{1-x2}Ca_{x2}MnO_3$(LCMO), and $La_{1-x3}Sr_{x3}MnO_3$(LSMO), and, in the above formulae, each of x1 to x3 may be independently identical to or different from each other and in the range of greater than 0 and less than 1.

The conductive oxide may be at least one selected from the group consisting of $La_{1-x2}Ca_{x2}MnO_3$(LCMO) and $La_{1-x3}Sr_{x3}MnO_3$(LSMO), for example, $La_{0.8}Sr_{0.2}MnO_3$, but the present disclosure is not limited thereto.

The first layer 11 may be formed as a single layer or a plurality of layers as long as it includes a conductive oxide having the perovskite crystal structure. For example, the first layer 11 may be formed as a single layer including LSMO or as multiple layers in which an LSMO layer is disposed on an LCMO layer, but the present disclosure is not limited thereto.

The capacitor of the present disclosure also includes a second layer 12 disposed on the first layer 11.

In one embodiment, the second layer 12 includes a ferroelectric substance. The term "ferroelectric substance" as used herein refers to a material having spontaneous polarization in a natural state, and a direction of the spontaneous polarization may be changed by an external electric field. The ferroelectric substance may be an oxide having a perovskite crystal structure.

For example, the oxide having a perovskite crystal structure may be one or more selected from the group consisting of $Pb(Zr_{1-y1}Ti_{y1})O_3$(PZT), $BiFeO_3$(BFO), and $BaTiO_3$ (BRO), where y1 may be greater than 0 and less than 1.

The ferroelectric substance may be, for example, one selected from the group consisting of $Pb(Zr_{1-y1}Ti_{y1})O_3$ (PZT), $BiFeO_3$(BFO), and $BaTiO_3$(BRO), for example, $PbZr_{0.52}Ti_{0.48}O_3$, but the present disclosure is not limited thereto.

The second layer 12 may be formed as a single layer or a plurality of layers as long as it includes the oxide having a perovskite crystal structure. For example, the second layer 12 may be formed as a single layer including PZT, but the present disclosure is not limited thereto.

The thickness of the second layer 12 may range from about 2 nm to about 10 nm, for example, about 3 nm to about 5 nm, but the present disclosure is not limited thereto. Since the second layer 12 is formed with a thickness of about 2 nm to about 10 nm, active metal ions, which will be described below, may smoothly move to the second layer 12 or therefrom, and, accordingly, a metal cation transfer phenomenon and a ferroelectric polarization inversion phenomenon may be simultaneously used, and an external electric field and an internal electric field by polarization of the inside of a ferroelectric thin film may be simultaneously controlled, thereby providing a high-performance capacitor capable of selectively regulating synaptic plasticity.

The capacitor of the present disclosure includes a third layer 13 directly disposed on the second layer 12.

The third layer 13 is directly disposed on a surface of the second layer 12. The expression "B directly disposed on A" or "B directly disposed on an upper or lower portion of A" as used herein means a case in which B is directly attached to a surface of A without another intervening layer therebetween, i.e., a case in which an intervening layer is not present between A and B. For example, the expression "a third layer directly disposed on a surface of a second layer" means a case in which the second layer 12 and the third layer 13 are sequentially formed.

In one embodiment, the third layer 13 includes an active metal. Since the third layer 13 includes an active metal, the metal ions may smoothly move into the second layer 12 controlled to the thickness of about 2 nm to about 10 nm or therefrom. For example, when a predetermined voltage is applied to the capacitor, the metal inside the third layer 13 is ionized. In this case, the metal ions may be introduced into the second layer 12 or released from the second layer 12. Accordingly, as described above, the metal cation transfer phenomenon and the ferroelectric polarization inversion phenomenon may be simultaneously used, and an external electric field and an internal electric field by polarization of the inside of a ferroelectric thin film may be simultaneously controlled, thereby providing a high-performance capacitor capable of selectively regulating synaptic plasticity.

For example, the active metal may be one or more selected from the group consisting of copper, silver, and nickel, or an alloy thereof, but the present disclosure is not limited thereto.

The third layer 13 may have a thickness of about 20 to about 200 nm, for example, about 5 nm to about 50 nm, but the present disclosure is not limited thereto. Since the third layer 13 is formed with a thickness of about 20 nm to about 200 nm, an appropriate thickness suitable for the manufacture and application of a device may be provided.

The present disclosure also provides a memory device including the capacitor 10 as described above. According to the present disclosure, a low-power and high-performance memory device capable of selectively regulating synaptic plasticity may be provided by controlling the movement of metal ions by an external electric field and an internal electric field by polarization of the inside of a ferroelectric thin film.

Figure 2A:
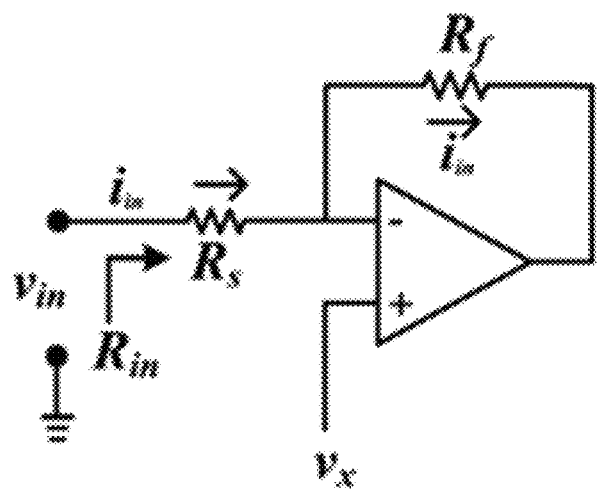
FIGS. 2A and 2B are a diagram schematically illustrating a unit cell of a memory device according to an embodiment of the present disclosure.
Figure 2B:
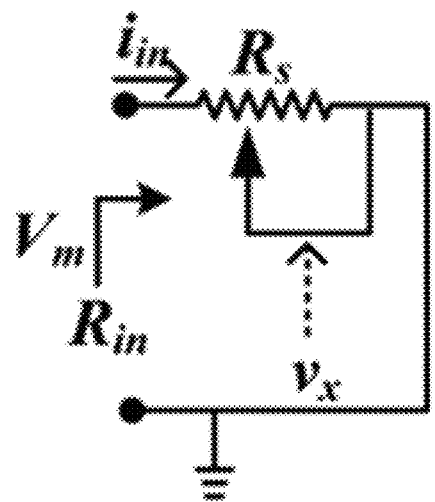

FIGS. 2A and 2B are a diagram illustrating a unit cell of a memory device according to an embodiment of the present disclosure.

As illustrated in FIGS. 2A and 2B, the unit cell of the memory device according to an embodiment of the present disclosure may include: a ground; a pulse generator connected to an upper electrode of a capacitor to supply a potential pulse having a constant width and height; a capacitor including an upper electrode, a lower electrode, and a ferroelectric layer therebetween; and a current limiter including a transistor connected to the lower electrode of the capacitor, a resistor connected to a base of the transistor, and a direct current (DC) power supply, but the present disclosure is not limited thereto.

As shown in FIGS. 2A and 2B, when a voltage is applied by the pulse generator, the capacitor is spontaneously polarized, and an electric current is outputted to the outside of the capacitor. At this time, the magnitude of the outflow current from the capacitor is limited to a certain level by the current limiter connected to the capacitor, and thus a rate of polarization generated inside the capacitor is adjusted. Such arbitrarily or stepwise adjusted polarization is sensed by a sense amplifier connected to an emitter of the transistor, and a cell, which is a minimum memory unit of volatile and non-volatile random access memory having multi-levels according to the controlled pulse, is finally obtained.

The present disclosure also provides a method of manufacturing the capacitor described above. According to the manufacturing method of the present disclosure, a capacitor may be manufactured by directly depositing an active metal electrode on an ultrathin ferroelectric layer having a certain thickness and, accordingly, the movement of metal cations and ferroelectric polarization inversion may be simultaneously controlled, thereby providing a low-power and high-performance capacitor capable of selectively regulating synaptic plasticity.

The method of manufacturing the capacitor, according to the present disclosure, includes forming the first layer 11, forming the second layer 12, and forming the third layer 13.

The forming of the first layer 11 is a process of forming, on a substrate, the first layer 11 including the above-described perovskite conductive oxide, and a detailed description of the substrate and the perovskite conductive oxide has already been provided and thus will be omitted here.

The forming of the second layer 12 is a process of forming, on the first layer 11, the second layer 12 including the above-described ferroelectric substance and having a thickness of about 2 nm to about 10 nm, and a detailed description of the ferroelectric substance and the thickness of the second layer 12 has already been provided and thus will be omitted here.

In one embodiment, the processes of forming the first and second layers 11 and 12 may be performed by pulsed laser deposition (PLD) or molecular beam epitaxy (MBE). PLD or MBE may be performed in a known or commercially available device, and other conditions (e.g., an internal pressure of a chamber, a deposition atmosphere, a temperature, power output, a voltage, and the like) in addition to the conditions described as being limited in the present specification may be appropriately selected from known conditions and are not particularly limited. The inside of the chamber may be a vacuum atmosphere or an inert gas atmosphere.

The forming of the third layer 13 is a process of forming the third layer 13 including an active metal on the second layer 12, and a detailed description of the metal has already been provided and thus will be omitted here.

The forming of the third layer 13 may be performed by various film forming methods known in the art, for example, various vacuum evaporation coating methods known in the art, such as sputtering, thermal evaporation deposition, electron-beam evaporation deposition, and the like, but the present disclosure is not limited thereto.

The method of manufacturing the capacitor, according to the present disclosure, may further include patterning the third layer 13. Accordingly, the third layer 13 may act as a metal electrode having a predetermined pattern.

For example, the patterning process may be performed using various lithography methods known in the art, for example, photolithography, nanoimprint lithography, soft lithography, electron beam lithography, or interference lithography, preferably, electron beam lithography, but the present disclosure is not limited thereto.

EXAMPLES

Hereinafter, the present disclosure will be described in further detail with reference to the following examples and comparative examples, but these examples are not intended to limit the scope of the present disclosure.

Example 1—Manufacture of Ferroelectric Tunnel Junction (FTJ) Device

A thin film having a PZT/LSMO heterostructure was grown on a monocrystalline $SrTiO_3$ (001) substrate by PLD using a KrF excimer laser ($\lambda$=248 nm). An energy density of the laser beam (1 Hz repetition rate) irradiated on the rotating LSMO and PZT targets was 1 J/cm$^2$. The LSMO and PZT films were deposited at an oxygen pressure of 100 mTorr and 200 mTorr, respectively and 675° C. and 550° C., respectively. After deposition, the PZT/LSMO films were heat-treated at 550° C. for 30 minutes at an oxygen pressure of 300 mTorr, and then cooled at a rate of 5° C./min. To manufacture an FTJ device, Ag (40 nm) upper electrodes having sizes of 0.6×0.6 μm$^2$ and 1.1×1.1 μm$^2$ were formed on the PZT/LSMO heterostructure by e-beam lithography and e-beam evaporation, followed by a liftoff process.

Example 2

An FTJ device was manufactured in the same manner as in Example 1, except that Cu (40 nm) upper electrodes having sizes of 0.6×0.6 μm$^2$ and 1.1×1.1 μm$^2$ were formed on the PZT/LSMO heterostructure by e-beam lithography and e-beam evaporation.

Comparative Example 1

An FTJ device was manufactured in the same manner as in Example 1, except that Au (40 nm) upper electrodes having sizes of 0.6×0.6 μm$^2$ and 1.1×1.1 μm$^2$ were formed on the PZT/LSMO heterostructure by e-beam lithography and e-beam evaporation.

Comparative Example 2

An FTJ device was manufactured in the same manner as in Example 1, except that Pt (40 nm) upper electrodes having sizes of 0.6×0.6 μm$^2$ and 1.1×1.1 μm$^2$ were formed on the PZT/LSMO heterostructure using e-beam lithography and a sputtering system.

Comparative Example 3

An Ag/LSMO heterostructure without a PZT thin film was manufactured in the same manner as in Example 1, except that only the LSMO thin film was grown on the monocrystalline $SrTiO_3$ (001) substrate.

Experimental Example

Figure 3A:
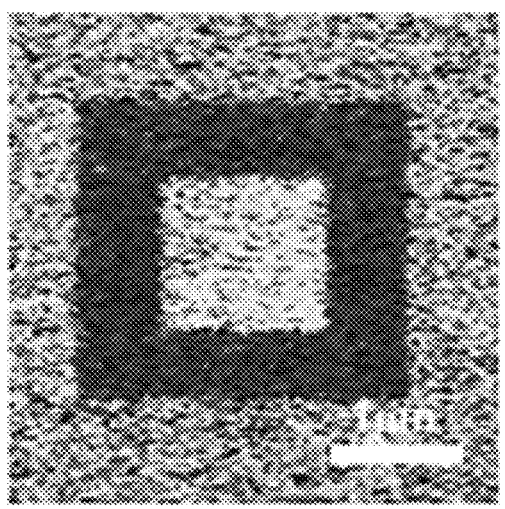
Figure 3A:
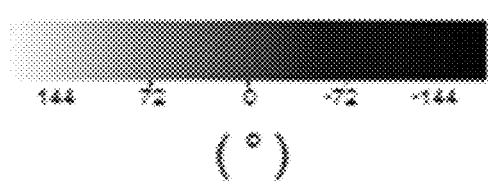
Figure 3B:
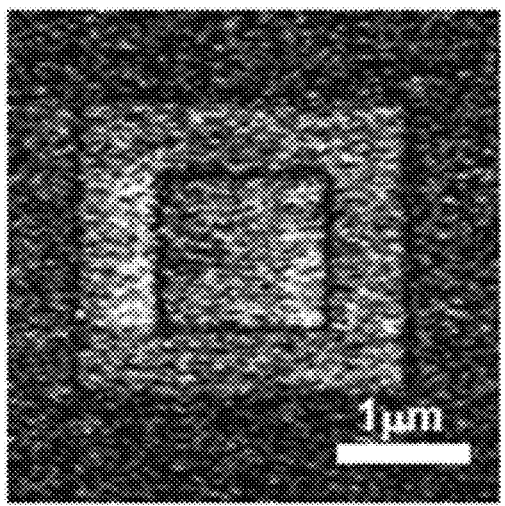
Figure 3B:
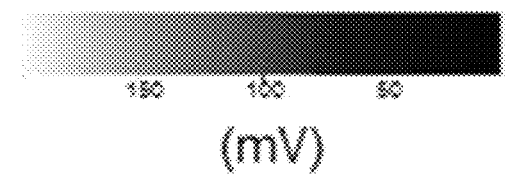
Figure 3C:
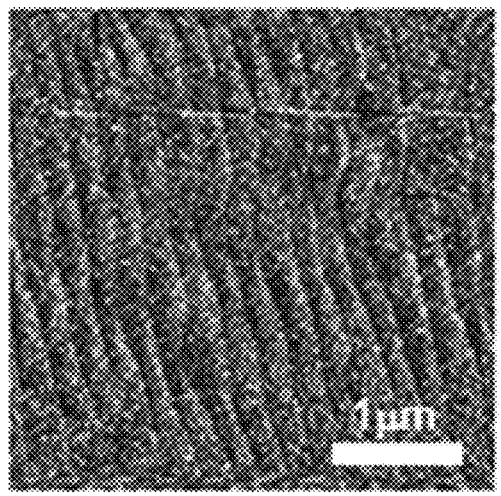
Figure 3C:
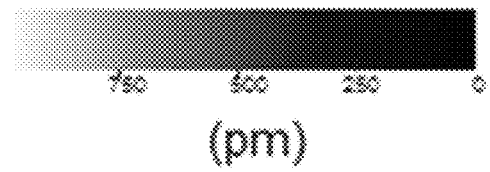
Figure 3D:
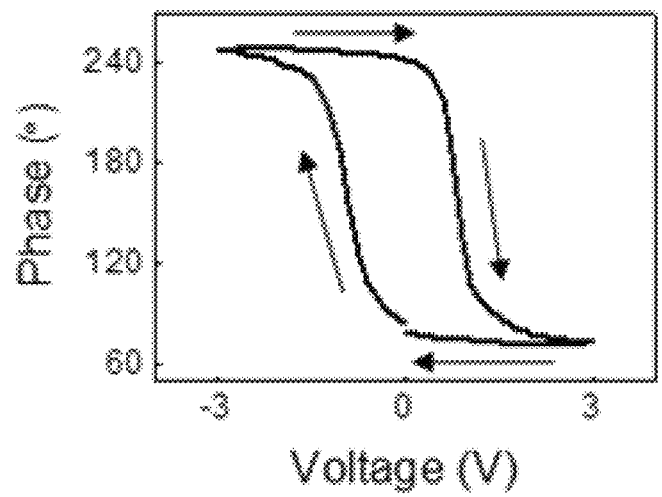
Figure 3E:
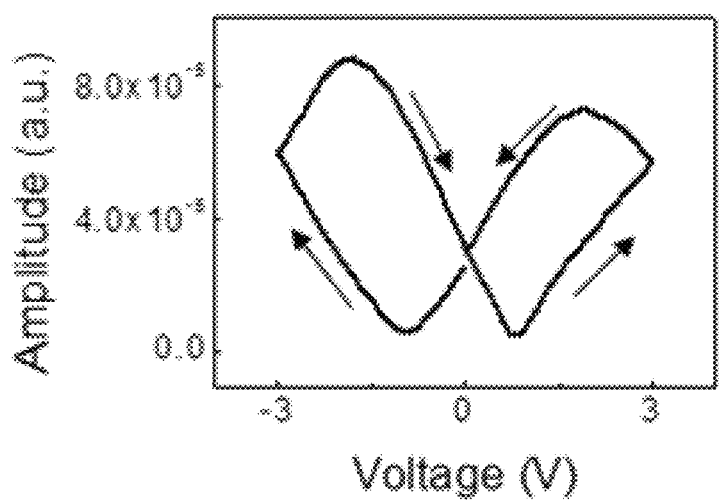

Structural Characteristics
High resolution-transmission electron microscopy (HR-TEM) images were acquired using a 300 kV field emission-TEM (Tecnai G$^2$ F30 super-twin). The thicknesses of thin films were measured using HR-TEM images.
Piezoresponse Force Microscopy (PFM)
PFM images and local magnetic hysteresis curves were measured using a Pt/Ir coated cantilever and an atomic force microscope (AFM, Park Systems, XE-100). A lock-in amplifier (Stanford Research Systems, SR830) was used after applying an AC voltage ($f$=15 kHZ) having a peak to peak amplitude of 1.0 V in a PFM mode.
Electrical Measurement
I-V characteristics were measured using a semiconductor parameter analyzer (Agilent, 4156B) and an AFM (Seiko, SPA-300 HV) in a DC voltage sweep mode. A pulse mode was used to provide pulse stimulation during gradual current modulation using a semiconductor characterization system (Keithley, 4200-SCS) and an AFM. All electrical measurements were performed in air at room temperature together with a Pt/Ir-coated cantilever.
Measurement Results
FIGS. 3A, 3B, 3C, 3D, and 3E are images showing measurement results of ferroelectric characteristics of PZT thin films grown by PLD, by using a PFM, which is one of the modes of AFM equipment. From the measurement results, it can be confirmed that a high-quality PZT thin film with ferroelectricity was grown through change of the direction of residual polarization according to a voltage applied to the grown PZT thin film and no surface change of the PZT ultrathin film by the applied voltage. In addition, as a result of measurement of crystallinity and a cross-section of the grown PZT thin film by HR-TEM, epitaxial growth to a thickness of about 4 nm can be confirmed as illustrated in FIG. 3F. More particularly, FIGS. 3A and 3B respectively illustrate the out-of-plane PFM phase and amplitude images of the PZT/LSMO heterostructure grown on a $SrTiO_3$ (STO) substrate. To obtain the images, an external voltage of 2.1 V was applied to a 3×3 µm² square by using a conductive AFM tip, and then an external voltage of −2.1 V was applied to a 1.5×1.5 µm² square. The PFM phase image shows a contrast between the outer (3×3 µm²) and inner (1.5×1.5 µm²) squares, which indicates that the two squares have different ferroelectric polarization directions. A similar contrast between the two squares observed in the PFM amplitude image demonstrates that the two squares have almost the same polarization amplitude. In addition, as shown in an AFM topographical image (see FIG. 3C) obtained after applying the external voltage, the applied voltage induces no surface change. Terrace-like structures in an AFM topographical image are typical features of epitaxial films grown in a layer-by-layer mode, which conform to their substrates. As illustrated in FIGS. 3D and 3E, local out-of-plane ferroelectric characteristics of the PZT film were investigated by measuring the hysteretic behavior of the PFM phase and amplitude at a specific point above the film. Coercive voltages of −1.0 V and 0.8 V were determined from the lowest values of amplitude loops that coincide with voltages at which sudden changes occur in phase loops. From the PFM images showing areas of the opposite polarization direction controlled by an external voltage (see FIGS. 3A and 3B) as well as results shown in FIGS. 3D and 3E, the ferroelectricity of the PZT films was confirmed by local hysteretic behavior. In addition, the crystallinity and epitaxial growth of the PZT/LSMO heterostructure were investigated using the HR-TEM cross-sectional image (see FIG. 3F). The epitaxial growth of the PZT and LSMO thin films was verified by the satisfactorily arranged lattice in the HR-TEM image. The thickness of the PZT thin film was measured at about 4 nm from the image.

Furthermore, to evaluate the stability of a ferroelectric domain in the PZT/LSMO heterostructure, PFM phase images were obtained after 30 minutes and 2 hours at room temperature, respectively. As illustrated in FIGS. 4A and 4B, it can be confirmed that the domain structure is hardly changed even after 2 hours, indicating stability at room temperature.

FIGS. 5A to 5H illustrate current-voltage graphs measured using different upper electrodes and mechanisms thereof. As can be seen from the data, the devices manufactured according to Examples 1 and 2 using ionizable electrodes (Ag and Cu) exhibit similar resistance changes according to an externally applied voltage, due to an external electric field and a polarization direction of the ferroelectric substance. From the results, it can be confirmed that the devices of Examples 1 and 2 have a high on/off ratio ($10^7$).

Figure 5A:
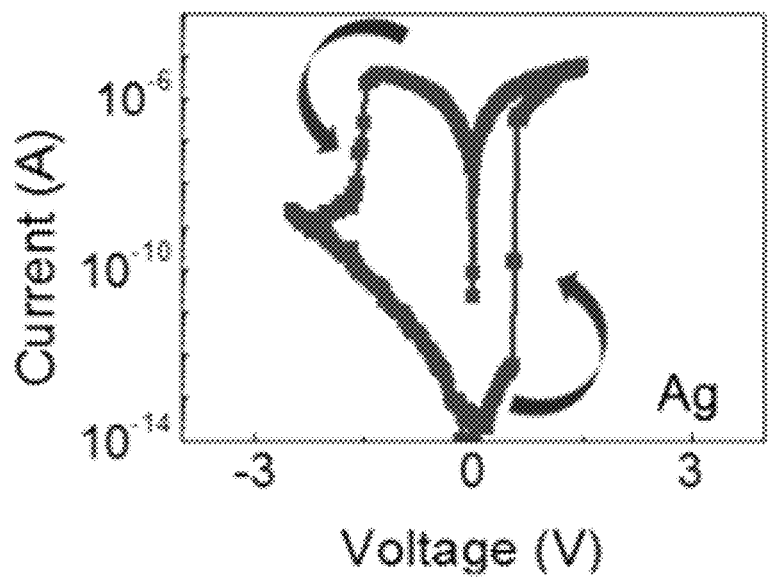
FIGS. 5A to 5H illustrate resistance state changes and mechanisms, depending on the type of upper electrode.
Figure 5B:
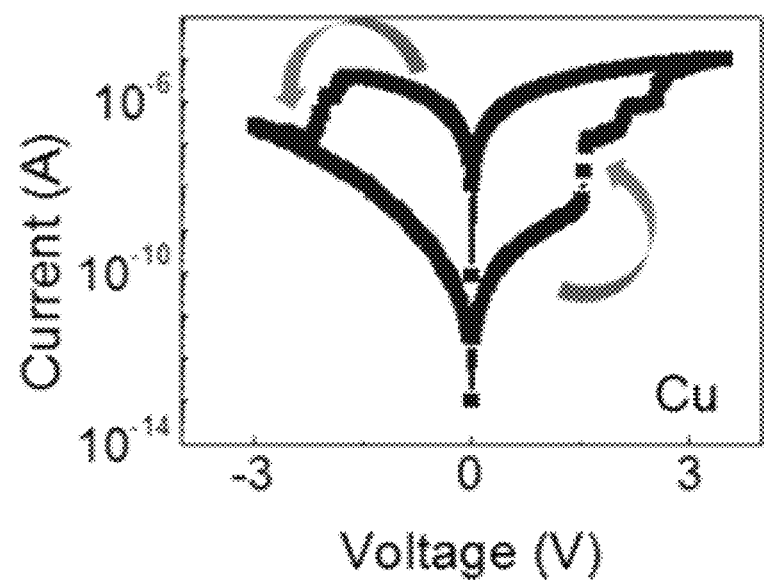
Figure 5C:
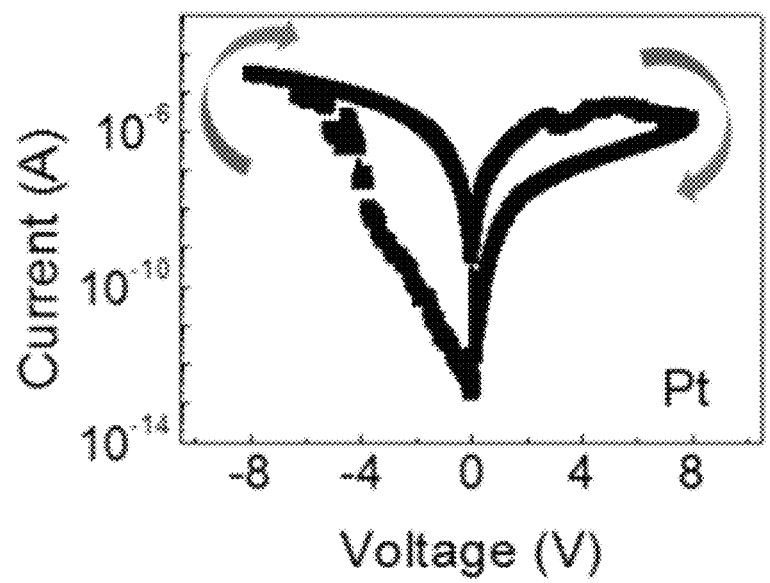
Figure 5D:
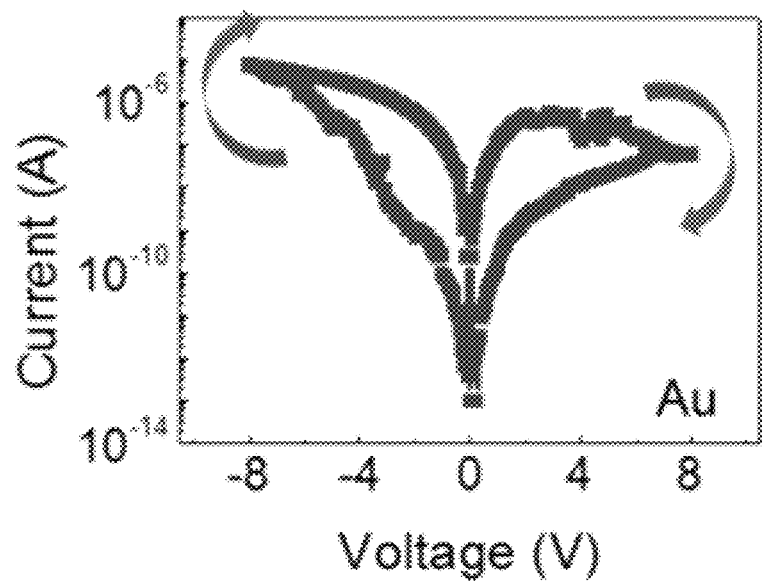
Figure 5E:
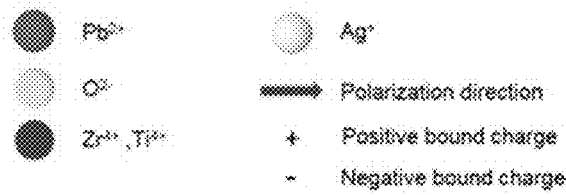
Figure 5E:
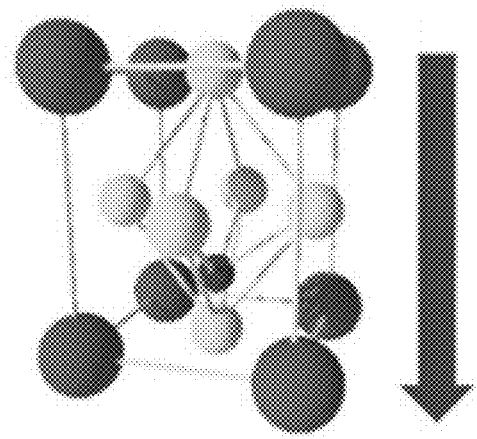
Figure 5F:
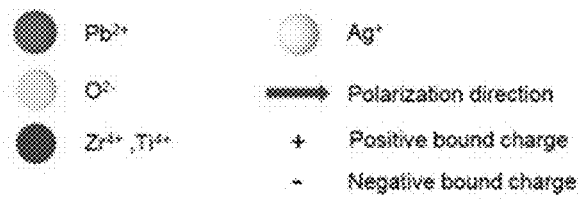
Figure 5F:
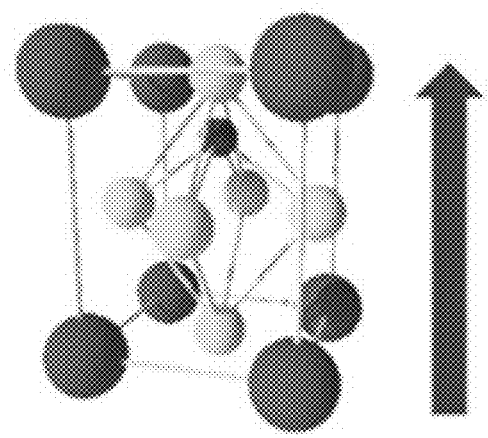
Figure 5G:
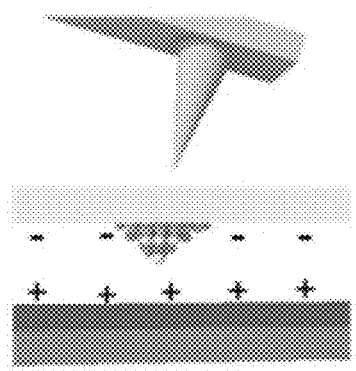
Figure 5H:
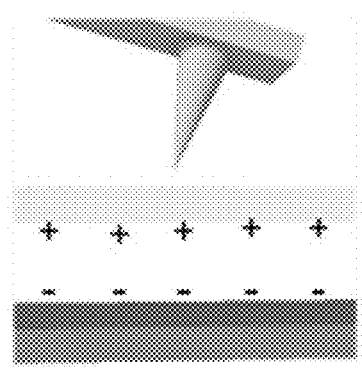

More particularly, to measure resistive switching behavior, each of silver (Ag), copper (Cu), gold (Au), and platinum (Pt) upper electrodes was manufactured. As illustrated in FIG. 5A, in the I-V curve where set switching (off to on) and reset switching (on to off) occur at positive and negative voltages, respectively, the Ag/PZT/LSMO device of Example 1 exhibits bipolar resistive switching behavior. In addition, the Ag/PZT/LSMO device of Example 1 has a high on/off ratio ($10^7$) and does not need an electroforming process before repetitive switching. The high on/off ratio may be due to ferroelectric polarization switching and ion transfer.

The present disclosure proposes a resistive switching mechanism based on the migration of ions via an external electric field and an ultrathin oxide having ferroelectric polarization in the Ag/PZT/LSMO heterostructure. When a positive bias is applied to the Ag upper electrode, the ferroelectric polarization below the Ag upper electrode tends to point downward, and negative bound charges move to the Ag/PZT upper interface (see FIGS. 5E and 5F). An electric field is generated by the positive bias externally applied to the Ag upper electrode and the negative bound charges accumulated at the Ag/PZT interface, and thus Ag cations smoothly move from the Ag upper electrode to the PZT thin film. The ferroelectric barrier width becomes thinner due to the migrated Ag ions, leading to a higher tunneling transmittance and switching to a low resistance on-state of the Ag/PZT/LSMO device. It should be noted that the resistive switching behavior of the Ag/PZT/LSMO device of Example 1 is different from existing conductive bridge-based resistive switching induced by the migration of ions. From parameter extraction using the following model, it was confirmed that, in I-V curves thereof in on- and off-states, the conductive bridge-based resistive switching was seen as resistive behavior (on-off) and tunneling behavior (off-state), while, in spite of the migration of ions, resistive behavior was not shown and direct tunneling behavior was shown in the on-state of the Ag/PZT/LSMO device (see FIGS. 6A, 6B, 7A, 7B and 7C).

That is, an estimate of barrier properties of the Ag/PZT/LSMO FTJ, and the height and width thereof may be obtained from fitting of the I-V data to a suitable model. In the present analysis, the current density J given by Gruverman et al. was used. In a trapezoidal potential barrier (Brinkman model) using the Wentzel-Kramers-Brillouin approximation, $$J \cong C \frac{\exp\left\{\alpha(V)\left[\left(\varphi_2 - \frac{eV}{2}\right)^{\frac{3}{2}} - \left(\varphi_1 + \frac{eV}{2}\right)^{\frac{3}{2}}\right]\right\}}{\alpha^2(V)\left[\left(\varphi_2 - \frac{eV}{2}\right)^{\frac{1}{2}} - \left(\varphi_1 + \frac{eV}{2}\right)^{\frac{1}{2}}\right]^2} \times$$

$$\sinh\left\{\frac{3}{2}\alpha(V)\left[\left(\varphi_2 - \frac{eV}{2}\right)^{\frac{1}{2}} - \left(\varphi_1 + \frac{eV}{2}\right)^{\frac{1}{2}}\right]\frac{eV}{2}\right\}$$

$$C = -\frac{4em^*}{9\pi^2\hbar^3}, \alpha \equiv \frac{4d(2m^*)^{\frac{1}{2}}}{3\hbar(\varphi_1 + eV - \varphi_2)^2}, \text{ where,}$$

m* denotes an effective tunneling electron mass, d denotes a barrier width, and $\varphi_1$ and $\varphi_2$ denote barrier heights of the corresponding interfaces.

Figure 6A:
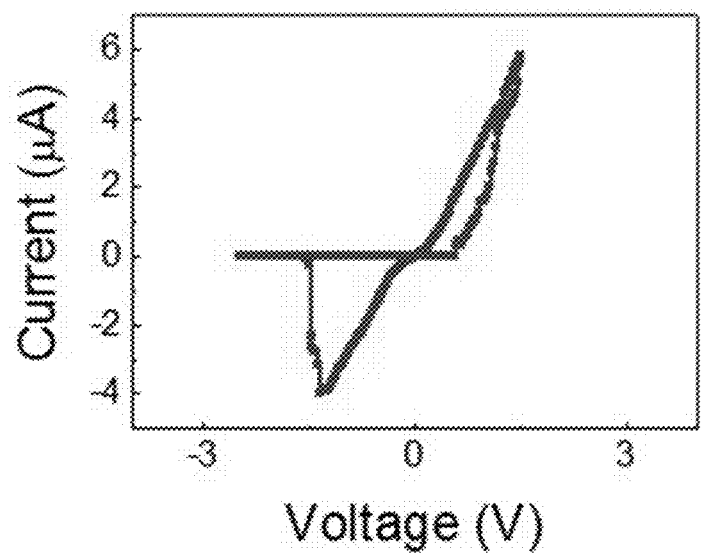
FIGS. 6A and 6B illustrate graphs showing linear scale I-V curves and on-state current in a low voltage region of a device manufactured according to Example 1.
Figure 6B:
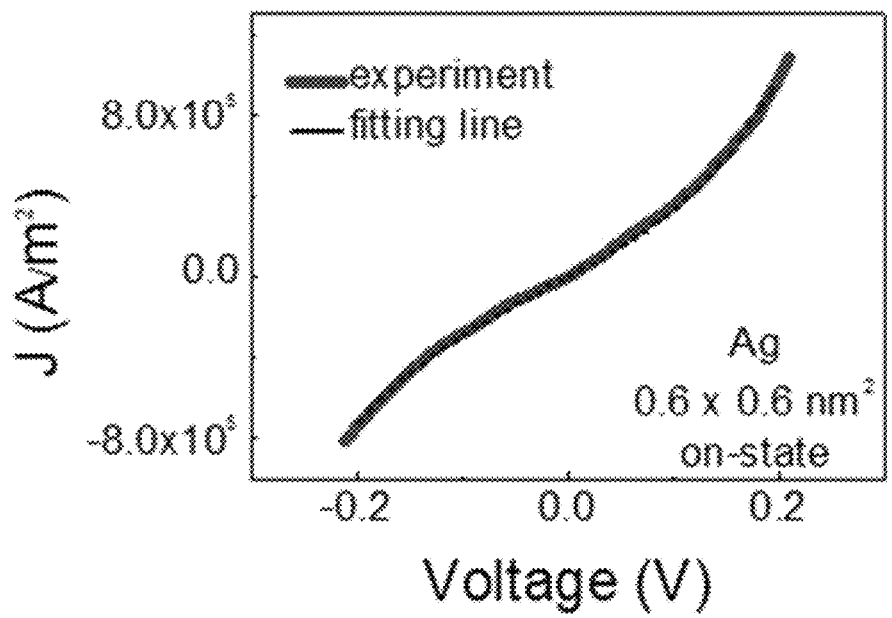
Figure 7A:
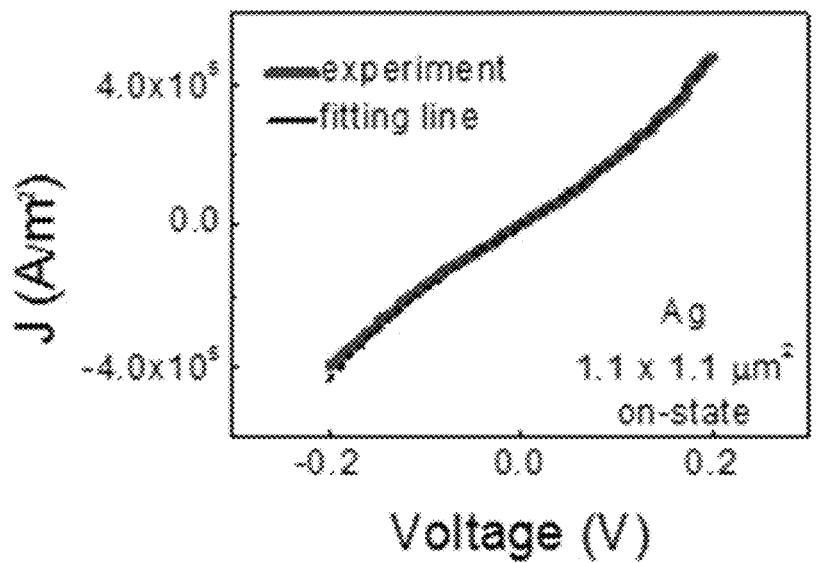
FIGS. 7A to 7C illustrate graphs showing I-V curves in on- and off-states of the device of Example 1 and fitting results thereof.
Figure 7B:
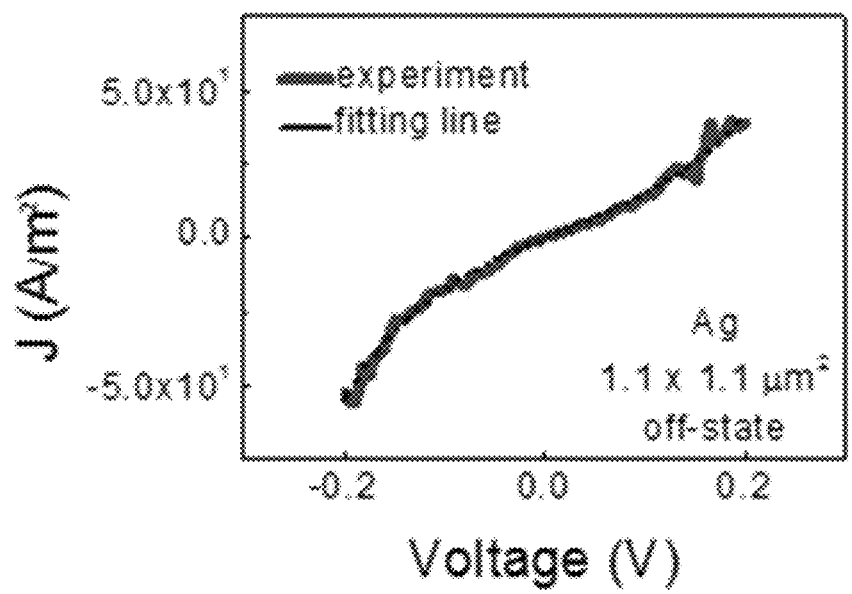
Figure 7C:
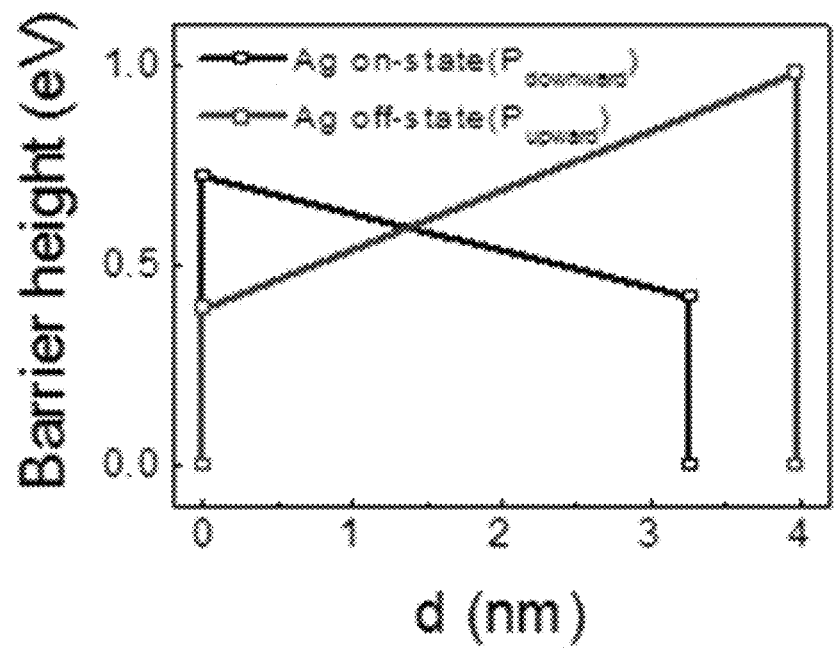

In the calculation performed using Matlab, M1, FE, and M2 were considered as Ag, PZT, and LSMO in a metal (M1)/ferroelectric (FE)/metal (M2) heterostructure. FIG. 6A, which is a log-scale curve, shows a linear scale I-V curve of the Ag/PZT/LSMO device including the Ag upper electrode having a size of 0.6×0.6 µm² shown in FIG. 5A. The on-state current shows non-resistive behavior, and, in particular, a low voltage portion thereof (see FIG. 6B) may be fitted with excellent accuracy by the equation above. It is not appropriate to apply an off-state current measured at a noise-level current to the equation above. To increase the off-state current from a noise level, as illustrated in FIGS. 7A and 7B, an I-V curve of the Ag/PZT/LSMO device including the upper electrode with a size of 1.1×1.1 µm² was obtained. The I-V curve is satisfactorily fitted by the equation above in both the on-state and the off-state. From the fitting results, barrier height and width are obtained as follows: $\varphi_1$=0.72 eV, $\varphi_2$=0.42 eV, and d=3.27 nm in the on-state; and $\varphi_1$=0.39 eV, $\varphi_2$=0.98 eV, and d=3.98 nm in the off-state. The obtained values are summarized in FIG. 7C. Changes in barrier height and width may be attributed to ferroelectric polarization inversion and ion transfer, respectively. Unlike existing FTJs in which only changes in barrier height occur, the Ag/PZT/LSMO structure of the present disclosure exhibits a high on/off ratio ($10^7$) due to changes in both barrier height and width.

This means that the migrated Ag ions of the Ag/PZT/LSMO structure of the present disclosure do not form a complete conductive bridge, but decrease a tunneling barrier width in the on-state (see FIGS. 6A, 6B, 7A, 7B and 7C), and this is because positive bound charges accumulated at the PZT/LSMO interface inhibit the Ag cations from reaching the LSMO lower electrode.

Meanwhile, a negative bias applied to the Ag upper electrode induces upward ferroelectric polarization and positive bound charges accumulated at the Ag/PZT interface. Due to an electric field generated by the external negative bias and the positive bound charges accumulated at the Ag/PZT interface, the Ag cations in the PZT thin film easily return to the Ag upper electrode (see FIGS. 5G and 5H), leading to a thick tunneling barrier width and switching to a high resistive off-state. The off-state current does not pass through a limited conductive bridge, but passes through the entire area below the upper electrode, and thus shows electrode size dependence (see FIGS. 8A to 8D).

For comparative evaluation, the Cu/PZT/LSMO device (Example 2), the Pt/PZT/LSMO (Comparative Example 2), and the Au/PZT/LSMO device (Comparative Example 1) were manufactured, and it has been known that a Cu electrode as well as an Ag electrode are ionizable, and Pt and Au electrodes are not ionizable. The Cu/PZT/LSMO device of Example 2 (see FIG. 5B) exhibits a bipolar behavior similar to that of the Ag/PZT/LSMO device of Example 1, which suggests that transfer of Cu cations regulates the tunneling barrier width.

Figure 8A:
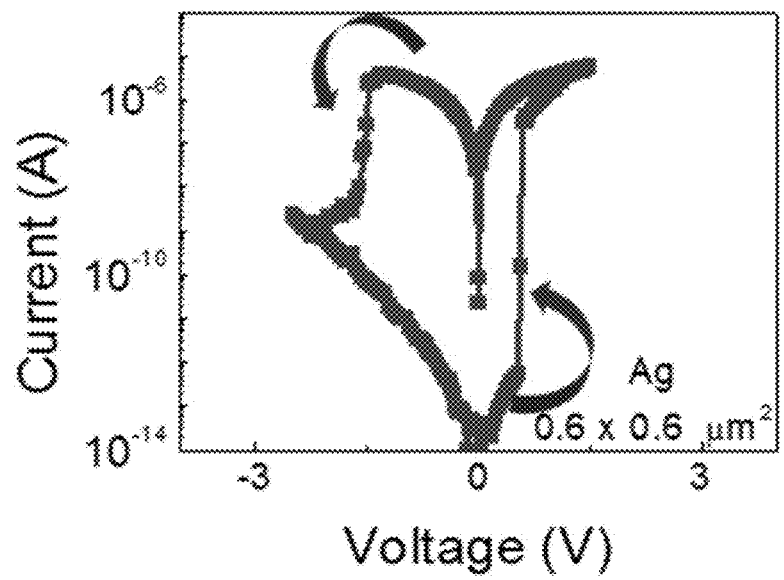
FIGS. 8A to 8D illustrate I-V curves of heterostructures of devices of Examples 1 and 2.
Figure 8B:
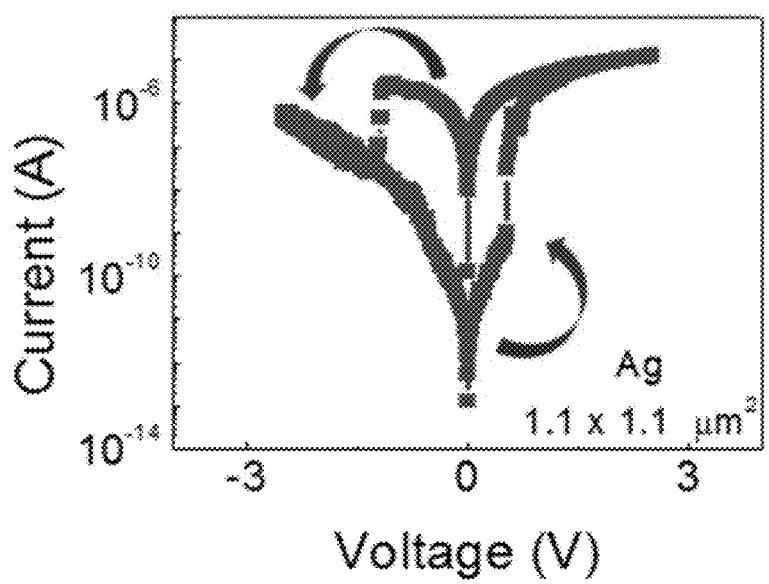
Figure 8C:
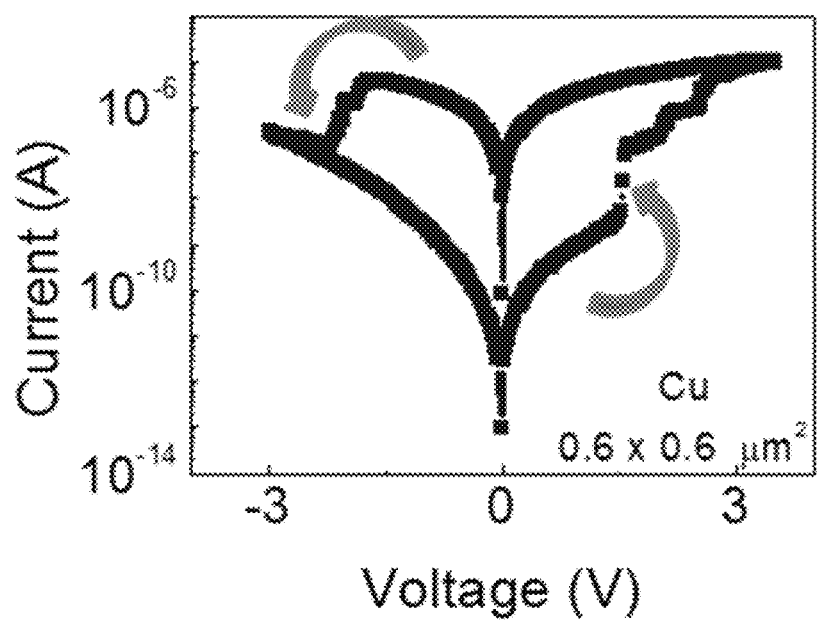
Figure 8D:
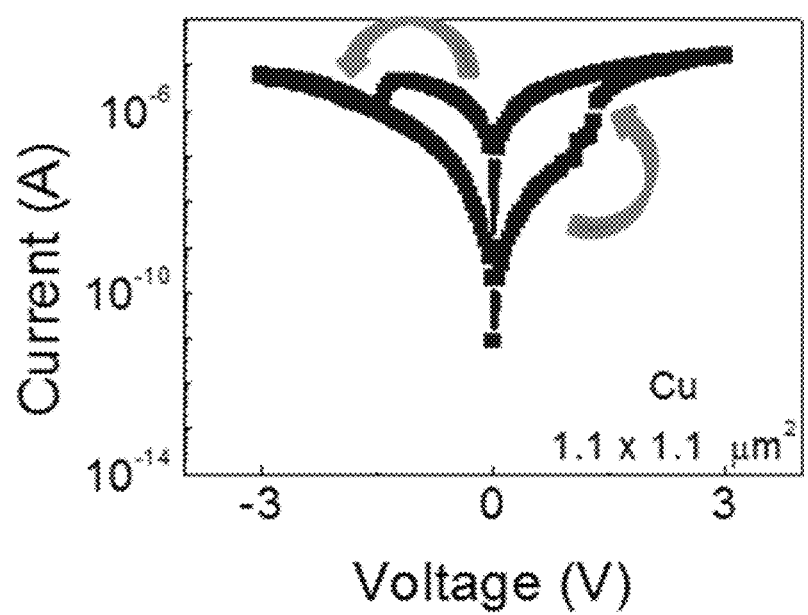
Figure 9A:
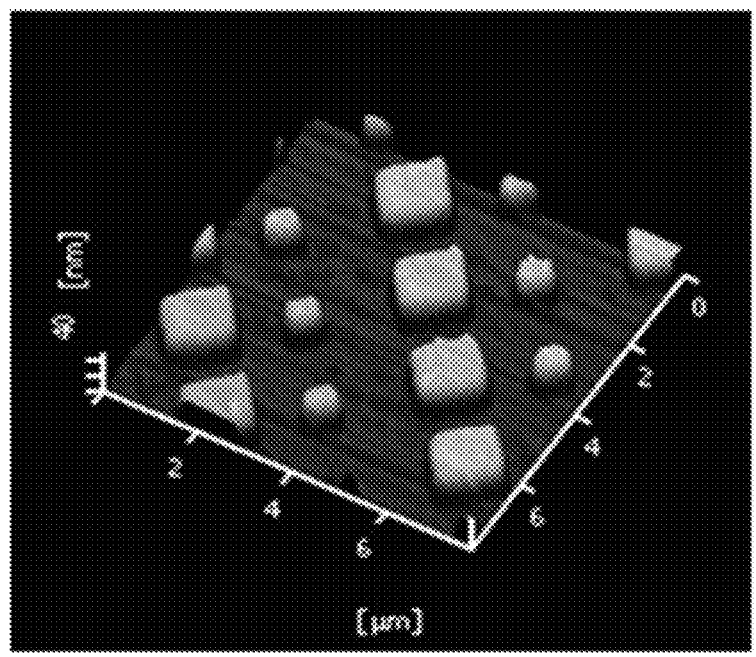
FIGS. 9A and 9B illustrate atomic force microscopy (AFM) topographic images of an upper electrode patterned in an existing PZT/LSMO heterostructure.
Figure 9B:
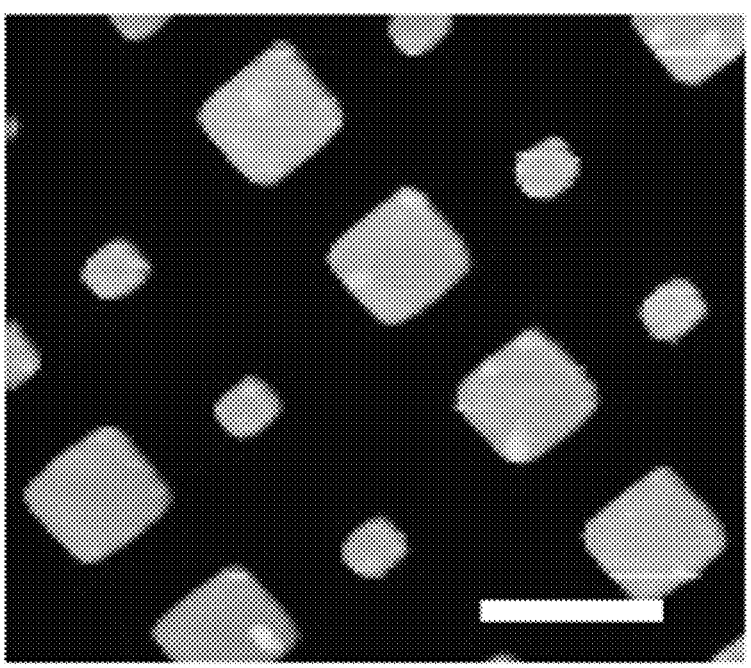

In addition, FIGS. 8A to 8B illustrate I-V curves according to the sizes of electrodes of the Ag/PZT/LSMO heterostructure of Example 1 and the Cu/PZT/LSMO heterostructure of Example 2. The heterostructure including the upper electrode with a size of 0.6×0.6 µm$^2$ exhibits a much lower off-state current than that of the heterostructure including the upper electrode with a size of 1.1×1.1 µm$^2$, which indicates that the off-state tunneling current flows through the entire area of the upper electrode. Meanwhile, when the size of the upper electrode increases from 0.6×0.6 µm$^2$ to 1.1×1.1 µm$^2$, there is no change in on-state current of each heterostructure, which means that the on-state tunneling current flows through an end of the conductive bridge that is not completely formed from the upper electrode.

Meanwhile, the Pt/PZT/LSMO device of Comparative Example 2 and the Au/PZT/LSMO device of Comparative Example 1 (see FIGS. 5C and 5D) exhibit a switching direction opposite to that of the Ag/PZT/LSMO device of Example 1 (see FIG. 5A), and this cannot be explained by the transfer of Pt or Au cations originating from the Pt or Au upper electrode. When considering that the resistive switching characteristics of the Pt/PZT/LSMO device of Comparative Example 2 and the Au/PZT/LSMO device of Comparative Example 1 are similar to each other, and resistive switching voltages thereof are similar to coercive voltages of PFM phase hysteretic curves thereof (see FIG. 11) and are characteristics exhibited using the Pt and Au electrodes which are impossible to be activated, it can be inferred that the opposite switching direction is due to hole accumulation or depletion at the PZT/LSMO interface according to the polarization direction of the PZT, not the interface between the upper electrode and the PZT.

Figure 10:
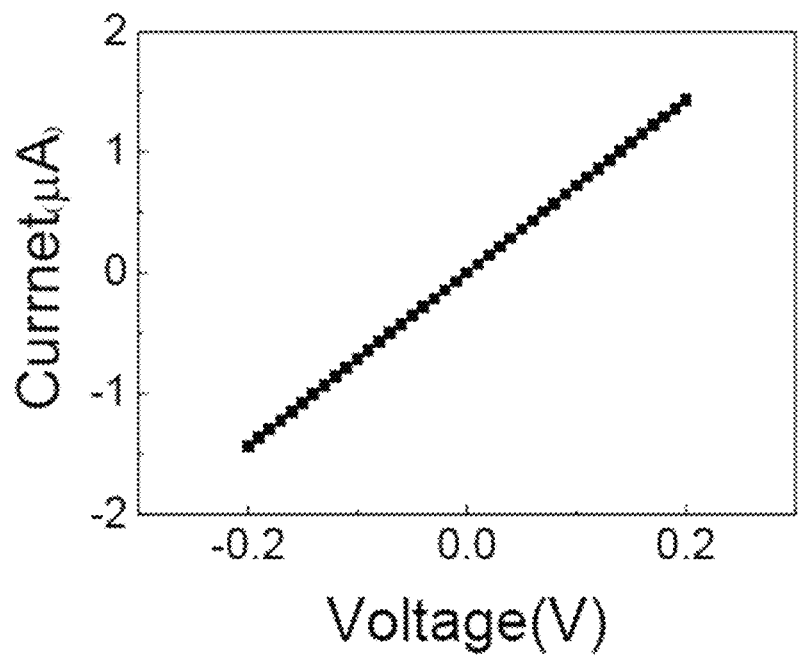
FIG. 10 is a graph showing a resistance pattern of a PZT thin film-free Ag/LSMO electrode heterostructure of Comparative Example 3.

FIG. 10 illustrates the resistive behavior of the Ag/LSMO electrode heterostructure without the PZT thin film. Thus, if a complete conductive filament is formed between the Ag upper electrode and the LSMO lower electrode of the Ag/PZT/LSMO structure in an on-state, the resistive I-V curve may be shown similar to that observed for the junction of the Ag/LSMO electrodes. However, transfer of carriers through the Ag/PZT/LSMO structure of the present disclosure in the on-state is controlled by the tunneling mechanism as illustrated in FIGS. 6A, 6B, 7A, 7B and 7C, which suggests that a complete conductive filament is not formed in the PZT layer disposed between the Ag and LSMO electrodes.

Figure 11:
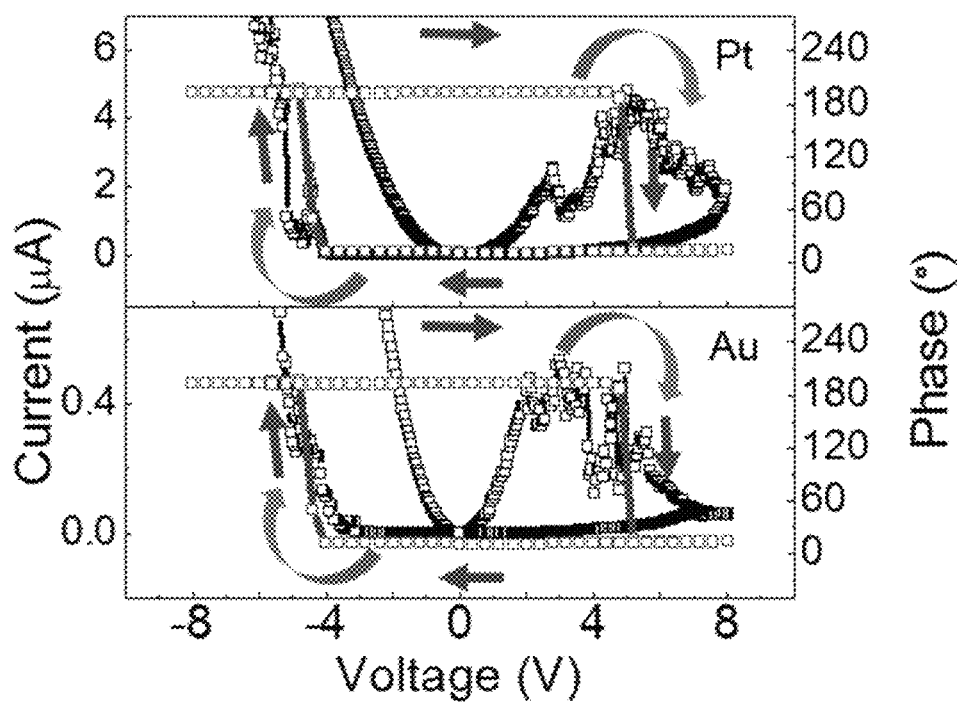
FIG. 11 illustrates I-V curves and PFM phase hysteresis loops of Comparative Example 2.

FIG. 11 illustrates I-V curves and PFM phase hysteresis loops of the Pt/PZT/LSMO device of Comparative Example 2 and the Au/PZT/LSMO device of Comparative Example 1, and the similarity between the resistive switching voltages and the coercive voltages suggests that the resistive switching of the Pt/PZT/LSMO device of Comparative Example 2 and the Au/PZT/LSMO device of Comparative Example 1 is caused by ferroelectric polarization inversion.

Figure 12A:
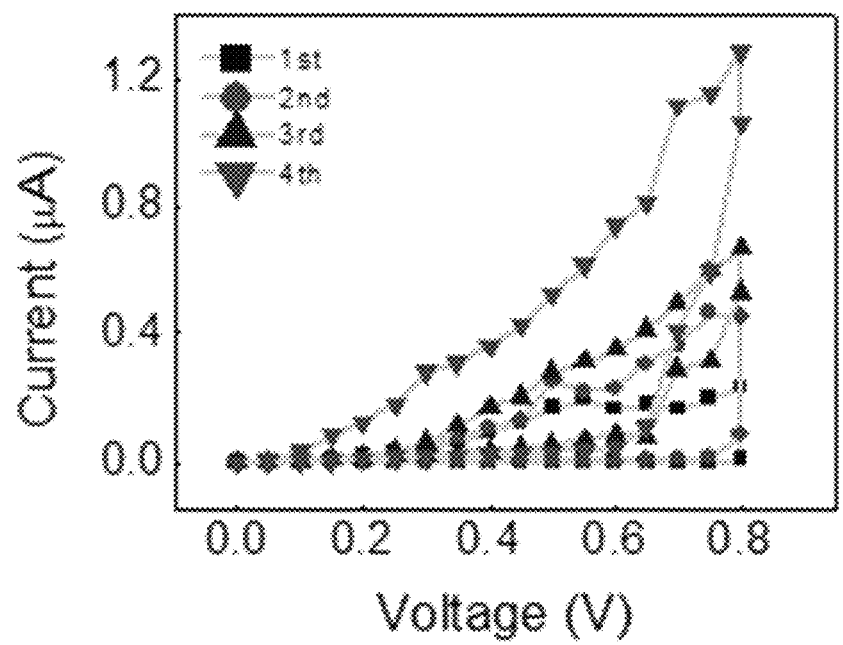
FIGS. 12A and 12B illustrate I-V curves of the device of Example 1, obtained by continuously applying positive (+) and negative (−) sweeping DC voltages, respectively.
Figure 12B:
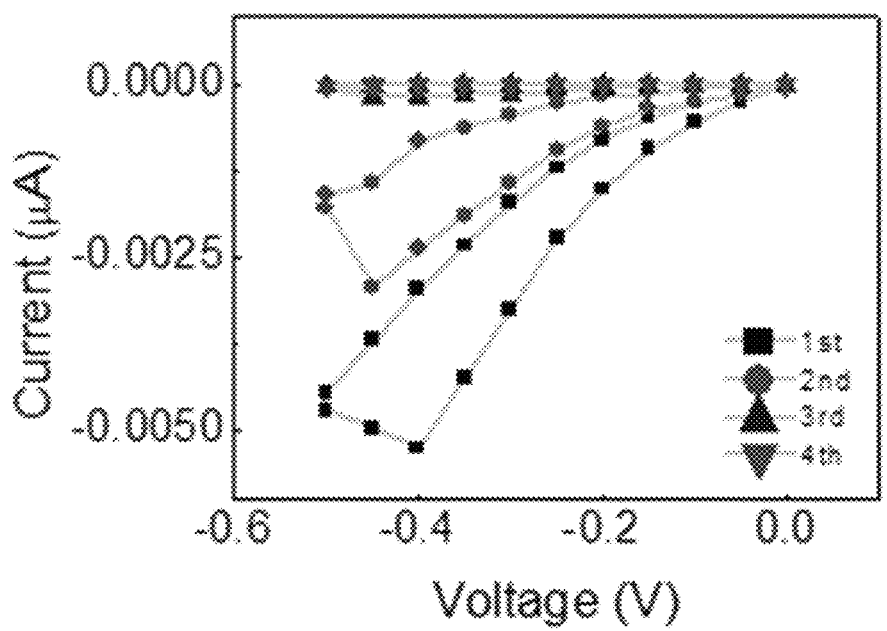

FIGS. 12A and 12B are I-V curves of the Ag/PZT/LSMO device, obtained by continuously applying four repeated sweeps of positive (+) and negative (−) DC voltages, respectively. The amplitude of the current values gradually increases (rises) and decreases (drops) by increasing the number of sweeps of the positive voltage (see FIG. 12A) and the negative voltage (see FIG. 12B), respectively.

Figure 13A:
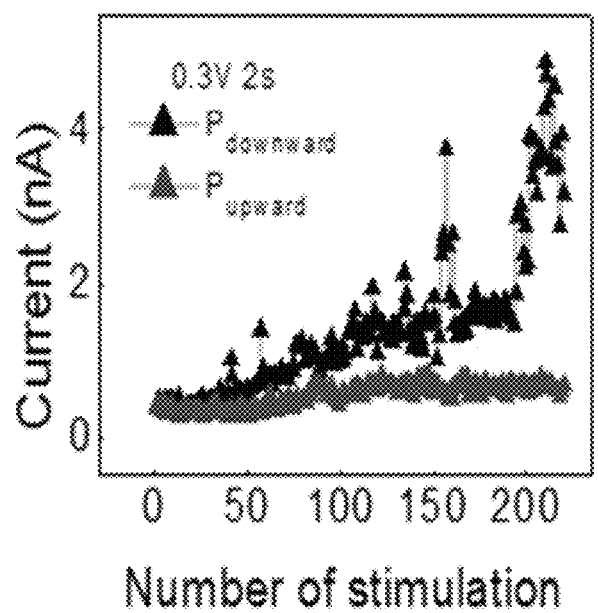
Figure 13B:
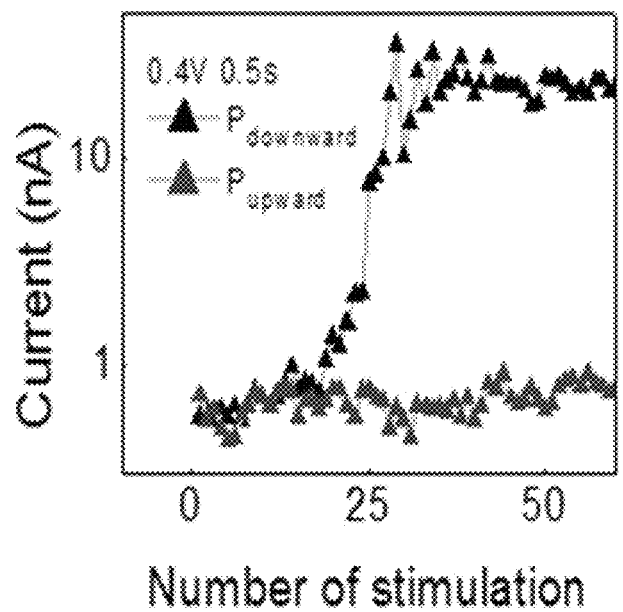

FIGS. 13A to 13C illustrate measurement results of resistance state changes according to the transfer of ions and polarization direction-dependent ion movement, through pulse stimulation. As the transfer of ions according to the polarization direction of a ferroelectric substance is controlled, the synaptic plasticity of a neuromorphic device may be controlled through pulse stimulation.

In particular, to study a relationship between the transfer of Ag ions and the ferroelectric polarization direction in the PZT thin film, rising behaviors in the opposite polarization directions were compared with each other. For downward polarization and upward polarization in the PZT thin film, each of external voltages of 3.0 V and −3.0 V was applied to the Ag electrode. Thereafter, consecutive pulses were applied with amplitudes and durations of (0.3 V, 2.0 s) and (0.4 V, 0.5 s), respectively, and the amplitude of the pulses was much smaller than the coercive voltage (set voltage) of the PZT. As seen as black triangular points in FIGS. 13A and 13B, the current level was gradually increased by consecutive stimulation voltage pulses in the downward polarization of the inside of the PZT thin film. In contrast, red triangular points shown in FIGS. 13A and 13B suggest that, in the upward polarization state, the repeated pulses cannot increase the current level of the Ag/PZT/LSMO device. This demonstrates that the transfer of Ag ions in the PZT thin film is strongly affected by a depolarization field generated by ferroelectric polarization. In particular, the gradual increase in current level in the downward polarization is very similar to a learning effect in human memory, such as a gradual increase in synaptic plasticity. When the device of the present disclosure, capable of controlling synaptic plasticity by the ferroelectric polarization direction, is applied to an array structure, it provides an effective means for preventing crosstalk between neighboring devices, similar to neural circuit control known as the role of astrocytes in neurons.

Synaptic plasticity may be regulated by cooperation of pre-synaptic spikes and post-synaptic spikes, and the amount of variation relies on an effective flux, which is determined by the spike parameters including the amplitude, width, and number of pulses, and an interval therebetween. FIG. 13C illustrates downward polarization generated by consecutive stimulation positive pulses having amplitudes and durations of (0.3 V, 2.0 s), (0.4 V, 0.5 s), and (0.5 V, 0.5 s) and changes in the current level of the Ag/PZT/LSMO device. During measurement, a total number of pulses and an interval therebetween were fixed at 60 ms and 12 ms, respectively. The consecutive stimulation incudes slow and then sudden change in the current level, finally leading to a stable section. In other words, the learning effect was first reported in an exponential learning process, and the synaptic plasticity is reinforced and saturated by consistent and continuous learning processes. From the number of pulses applied when current changes occur, it can be confirmed that the number of applied pulses decreases due to an increase in pulse amplitude. In addition, the finally obtained current level increases with the pulse amplitude.

FIGS. 14A and 14B illustrate resistance state changes dependent on the program time of pulse stimulation. From the measurement results, it can be confirmed that a slow pulse stimulation program time, which is a limitation in existing ion transfer-based neuromorphic devices, may be overcome through transfer of ions accelerated by ferroelectric polarization, and thus the device has low power (sub-aJ).

In particular, in the given mechanism, a gradual change in direct tunneling current was expected to be enabled by the regulation of a barrier width caused by the transfer of ions. For synaptic potentiation, as illustrated in FIG. 14A, the device was turned off using a negative (−) pulse with a duration of 1.0 ms and an amplitude of −2.5 V, and then five consecutive stimulation positive (+) pulses were applied thereto with a fixed amplitude (2.2 V) and various durations (100 ns, 500 ns, and 1.0 μs). A reading pulse with an amplitude of 0.2 V and a 10 ms duration was applied after each programing voltage pulse was applied, to measure the current level. For synaptic depression, as illustrated in FIG. 14B, the device was turned on using a negative (−) pulse with a duration of 1.0 ms and an amplitude of −2.5 V, and then five consecutive stimulation negative (−) pulse were applied at a fixed amplitude of 2.2 V for various durations (100 ns, 500 ns, and 10 μs). Notably, both the rise and fall of the Ag/PZT/LSMO device of the present disclosure may be induced by extremely short pulse stimulation for 100 ns. Such a short programming time may be caused by a very short distance (<nm) near the Ag/PZT interface in the ultrathin FTJ, and the transfer of Ag ions accelerated by ferroelectric polarization. Thus, by minimizing the programming time, extremely low programming energy (synaptic reinforced energy consumption=about 22 aJ, and synaptic depression energy consumption=about 2.5 pJ) was achieved. These energies are much lower than an energy of previously reported conductive bridge memory-based synaptic devices (rising energy consumption=0.1 pJ to 0.1 nJ, and depression energy consumption=0.1 nJ to 0.1 μJ), which exhibit a much longer programming time and a much higher current level.

FIGS. 15A to 15D illustrate characteristics of short-term memory and long-term memory controlled by repetitive periods of pulse stimulation. Short-term memory (volatile), which cannot memorize resistance changes, and long-term memory (non-volatile), which memorizes resistance changes, may be controlled through changes in repetitive periods of pulse stimulation.

As illustrated in FIGS. 15A and 15B, in the Ag/PZT/LSMO device of the present disclosure that mimics short-term plasticity (STP) and long-term potentiation (LTP) of biological synapses, both short-term memory (volatile) and long-term memory (non-volatile) current states were experimentally verified. In STP, six consecutive stimulation voltage pulses, applied with a long repetition interval of 1.0 s, were fixed at an amplitude of 2.5 V and a duration of 500 ns. The Ag/PZT/LSMO device does not maintain a high current level, and rapidly returns to a low current value. During LTP programming, while pulse amplitude and duration were fixed at 2.5 V and 500 ns, respectively, a pulse repetition interval was decreased to 0.15 s. A particular transition to a gradually higher current level was observed with frequently repeated stimulation input pulses. That is, the transition from STP to LTP is strongly affected by a depolarization field: this is activated only in downward polarization of the PZT layer (see FIGS. 16A to 16E).

Figure 16B:
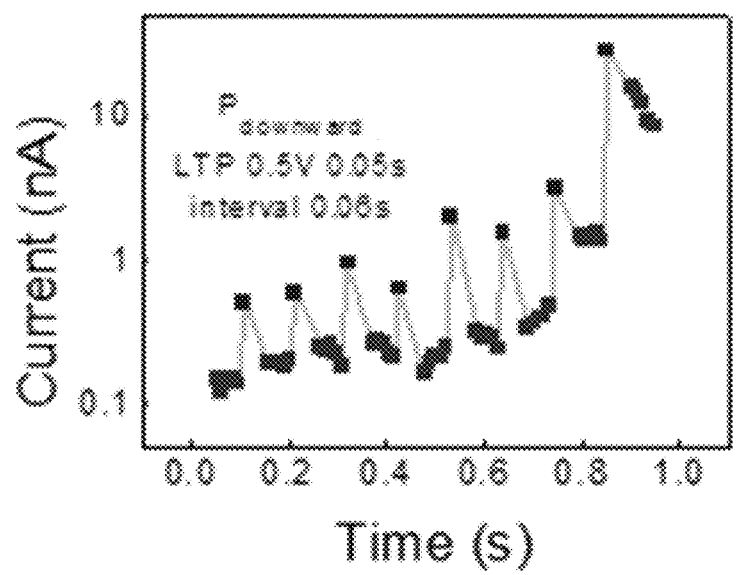
Figure 16C:
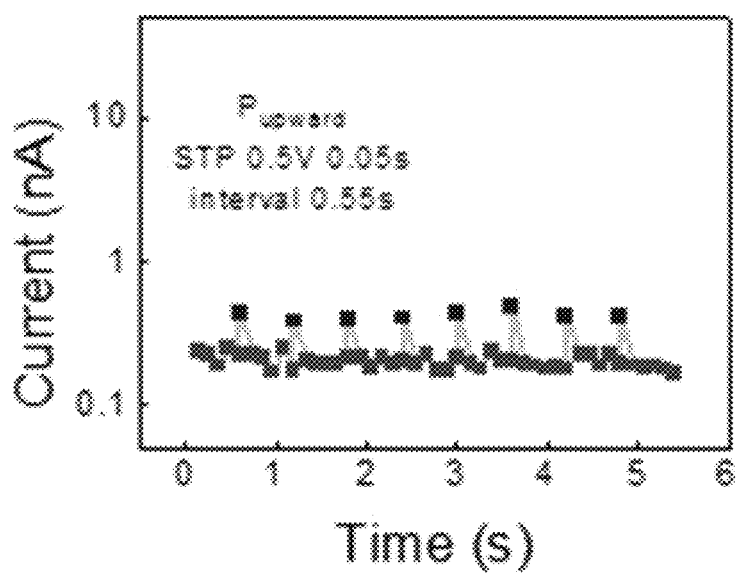
Figure 16D:
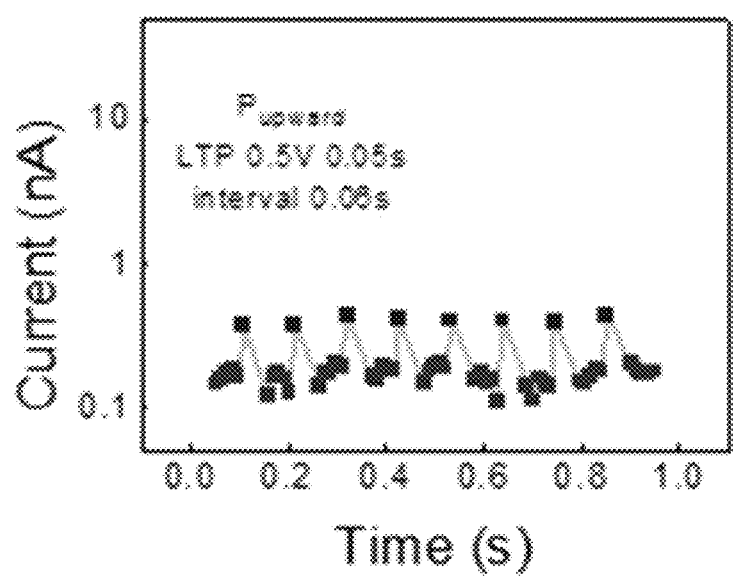
Figure 16E:
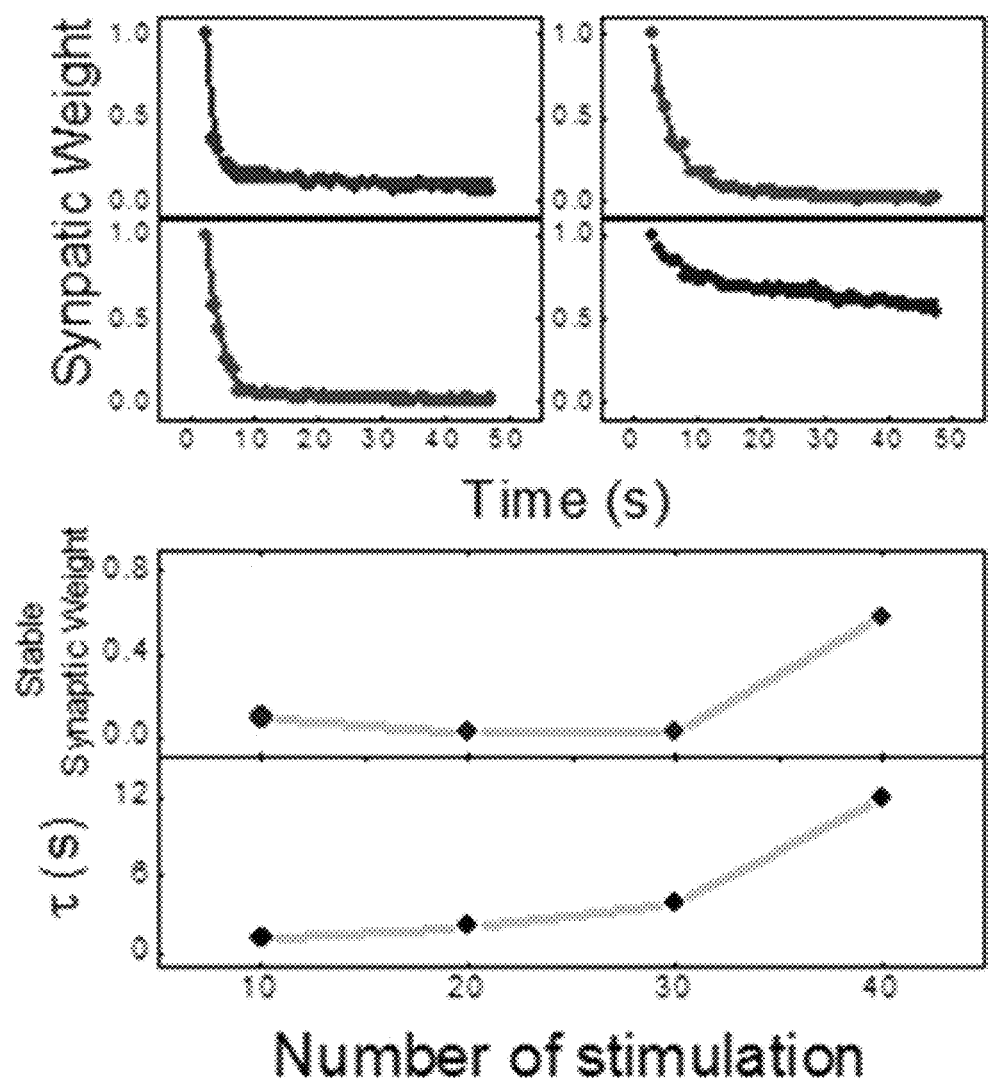

As illustrated in FIGS. 16A to 16E, both STP and LTP were verified to be dependent on the polarization direction. STP and LTP were subjected to eight consecutive stimulation voltage pulses (amplitude: 0.5 V and duration: 50 ms) at a long repetition interval (0.55 s) and a short repetition interval (0.06 s), respectively. FIGS. 16A and 16B respectively illustrate STP and LTP of downward polarization in the Ag/PZT/LSMO device of the present disclosure that mimics biological synapses. In contrast, FIGS. 16C and 16D show that the consecutively stimulated voltage pulses cannot induce a STP-to-LTP transition of the Ag/PZT/LSMO device in upward polarization. This data supports that the transfer of Ag ions in the PZT thin film is strongly affected by the depolarization field generated by ferroelectric polarization. To study the STP-to-LTP transition, N stimulation pulses (N=10, 20, 30, and 40) were applied, to the Ag/PZT/LSMO device having downward polarization in the PZT layer, with a fixed amplitude (0.5 V), duration (50 ms), and interval (60 ms). In FIG. 16E, an upper panel shows fitting results obtained using Equation (1) described in Li, S. et al. *J. Mater. Chem. C* 1, 5292 (2013) and time changes of normalized current levels obtained after applying the N stimulation pulses. From the fitting curves, a stable synaptic weight and a decay time constant may be obtained. As shown in a lower panel of FIG. 16E, the decay time constant and the stable synaptic weight increase with N. These phenomena provide a strong evidence for the STP-to-LTP transition in the device of the present disclosure. Thus, the STP-to-LTP transition may be selectively activated by ferroelectric polarization. The downward polarization and upward polarization of the PZT thin film respectively activate and deactivate the STP-to-LTP transition.

In addition, while an interval and amplitude thereof were maintained at 0.15 s and 2.5 V, respectively, 10 consecutive stimulation voltage pulses having a longer duration of 1.0 μs were applied to the device of the present disclosure. As illustrated in FIG. 15C, a transition with a long lifetime for a higher current level was achieved after the final input pulse corresponding to LTP.

The conductance of previously reported synapses was improved by the repeated voltage pulse and its decay time increasing with the number of stimulation pulses. To investigate decay time dependent on the number of stimulation pulses, N stimulation pulses (N=5, 20, 40, and 50) having a fixed amplitude (2.5 V), duration (1.0 μs), and interval (0.15 s) were applied. In FIG. 15D, an upper panel shows time changes of normalized current levels obtained after applying N stimulation pulses according to the results fitted using an exponential decay function:

$$I_t = I_0 + A\exp(-t/\tau)$$

wherein $I_t$ and $I_0$ are current values for a period of time t in a stable state, A is a prefactor, and τ is a decay time constant. When t<τ, the synaptic weight rapidly decreases. When t>>τ, the synaptic weight is slowly changed, and $I_t$ approximates $I_0$. From the fitting curves of FIG. 15D, it can be confirmed that $I_0$ and τ and z increase with N (see the lower panel of FIG. 15D). This phenomenon is strong evidence for the STP-to-LTP transition in the device of the present disclosure. The enhancement in stability by application of input pulses resembles the increase in synaptic connection following frequently repeated stimulation by action potentials found in the biological neural system. Notably, a single synaptic FTJ device of the present disclosure has a τ value similar to that in a previously reported case using a longer programming time (100 μs) and a narrower pulse interval (200 μs) than those used in the present disclosure, and this is inferred due to the fact that a depolarization field generated by negative bound charges at the Ag/PZT interface enhances the stability of Ag ions, and delays the return of the Ag ions to the Ag upper electrode. In summary, by utilizing the transfer of cations in an FTJ device consisting of Ag/PZT/LSMO, an energy efficient, ultra-small and widely operating synaptic device was completed. In addition, it is possible to control synaptic plasticity using a high on/off ratio ($10^7$) and a ferroelectric polarization direction.

That is, the present disclosure provides a novel single synaptic FTJ device consisting of a 4 nm PZT ultrathin film and a capacitor structure of Ag/PbZr$_{0.52}$Ti$_{0.48}$O$_3$ (PZT)/La$_{0.8}$Sr$_{0.2}$MnO$_3$ (LSMO). The ultrathin FTJ of the present disclosure, in which an external electric field and a depolarization electric field are simultaneously present, exhibits a high on/off ratio ($10^7$) considered as a result of the regulation of a tunneling barrier width due to Ag ion transfer and low energy consumption (synaptic reinforced energy consumption=about 22 aJ, and synaptic depression energy consumption=about 2.5 pJ). In addition, the ultrathin FTJ exhibits synaptic plasticity selectively activated by ferroelectric polarization and the STP-to-LTP transition. The downward polarization and upward polarization of the PZT layer respectively activate and deactivate synaptic plasticity. Thus, the Ag/PZT/LSMO structure of the present disclosure provides an energy efficient, ultra-small, and widely operating single synaptic device, synaptic plasticity of which is controlled according to a polarization direction.

In the present disclosure, to address disadvantages of existing ion transfer- and ferroelectric-based neuromorphic devices, such as a low on/off ratio, high power consumption, a low degree of integration, and the like, a novel neuromorphic device with a high on/off ratio, low power consumption, and a high degree of integration by simultaneously using the transfer of ions and ferroelectric polarization switching was manufactured. In addition, the device of the present disclosure may selectively control activation and deactivation thereof using ferroelectric polarization. This novel neuromorphic device is expected as a next-generation device that replaces silicon and existing oxides.

According to the present disclosure, a high-performance capacitor capable of selectively regulating synaptic plasticity may be provided by simultaneously controlling cation migration and ferroelectric polarization inversion.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:
1. A capacitor comprising:
a first layer comprising a conductive oxide;
a second layer disposed on the first layer, having a thickness of about 2 nm to about 10 nm, and comprising a ferroelectric substance; and
a third layer directly disposed on the second layer, having a thickness of about 20 nm to about 200 nm, and comprising an active metal;
wherein, when a voltage is applied, a metal in the third layer is ionized, wherein the metal ions are introduced into or released from the second layer by a polarization direction of the second layer and an external electric field.

2. The capacitor of claim 1, wherein the active metal comprises one selected from the group consisting of copper, silver, and nickel, or an alloy thereof.

3. The capacitor of claim 1, wherein the conductive oxide has a perovskite crystal structure.

4. The capacitor of claim 3, wherein the conductive oxide having a perovskite crystal structure comprises one or more selected from the group consisting of Pr$_{1-x1}$Ca$_{x1}$MnO$_3$ (PCMO), La$_{1-x2}$Ca$_{x2}$MnO$_3$ (LCMO), and La$_{1-x3}$Sr$_{x3}$MnO$_3$ (LSMO), wherein each of x1 to x3 is independently identical to or different from each other, and in a range of greater than 0 and less than 1.

5. The capacitor of claim 1, wherein the ferroelectric substance is an oxide having spontaneous polarization of a perovskite crystal structure.

6. The capacitor of claim 5, wherein the oxide having spontaneous polarization of a perovskite crystal structure comprises one or more selected from the group consisting of Pb(Zr$_{1-y1}$Ti$_{y1}$)O$_3$ (PZT), BiFeO$_3$ (BFO), and BaTiO$_3$ (BTO), wherein y1 is in a range of greater than 0 and less than 1.

7. A memory device comprising the capacitor of claim 1.

8. A method of manufacturing a capacitor according to claim 1, the method comprising:
forming a first layer comprising a conductive oxide on a substrate;
forming, on the first layer, a second layer comprising a ferroelectric substance and having a thickness of about 2 nm to about 10 nm; and
forming, on the second layer, a third layer comprising an active metal and having a thickness of about 20 nm to about 200 nm.

9. The method of claim 8, wherein the forming of the first layer and the forming of the second layer are performed by pulsed laser deposition or molecular beam epitaxy (MBE).

10. The method of claim 8, wherein the forming of the third layer is performed by electron beam deposition, thermal deposition, or sputtering.

11. The method of claim 8, further comprising patterning the third layer.

12. The method of claim 11, wherein the patterning is performed by electron beam lithography or photolithography.

* * * * *